(12) United States Patent
Kang et al.

(10) Patent No.: US 11,723,256 B2
(45) Date of Patent: Aug. 8, 2023

(54) METHOD AND APPARATUS FOR MANUFACTURING DISPLAY DEVICE

(71) Applicant: Samsung Display Co., Ltd., Yongin-si (KR)

(72) Inventors: Yeonju Kang, Yongin-si (KR);
Sanghoon Kim, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 406 days.

(21) Appl. No.: 17/010,590

(22) Filed: Sep. 2, 2020

(65) Prior Publication Data

US 2021/0210735 A1    Jul. 8, 2021

(30) Foreign Application Priority Data

Jan. 6, 2020 (KR) ........................ 10-2020-0001576

(51) Int. Cl.
| | | |
|---|---|---|
| *C23C 14/04* | (2006.01) | |
| *H10K 71/00* | (2023.01) | |
| *C23C 14/24* | (2006.01) | |
| *H10K 71/16* | (2023.01) | |

(52) U.S. Cl.
CPC ........... *H10K 71/00* (2023.02); *C23C 14/042* (2013.01); *C23C 14/24* (2013.01); *H10K 71/164* (2023.02); *H10K 71/166* (2023.02)

(58) Field of Classification Search
CPC .... H10K 71/166; H10K 71/164; H10K 71/00; C23C 14/042
See application file for complete search history.

(56) References Cited

U.S. PATENT DOCUMENTS

| | | | |
|---|---|---|---|
| 9,997,708 B2 | 6/2018 | Kim et al. | |
| 10,186,662 B2 | 1/2019 | Kim | |
| 10,236,475 B2 | 3/2019 | Kim | |
| 10,818,877 B2* | 10/2020 | Hong | ...................... H10K 71/00 |
| 10,868,268 B2* | 12/2020 | Kim | .......................... C23C 14/24 |
| 11,171,288 B2* | 11/2021 | Jang | ....................... H10K 71/00 |

(Continued)

FOREIGN PATENT DOCUMENTS

| | | |
|---|---|---|
| KR | 10-2017-0086160 A | 7/2017 |
| KR | 10-2017-0091243 A | 8/2017 |

(Continued)

*Primary Examiner* — Jaehwan Oh
(74) *Attorney, Agent, or Firm* — Lewis Roca Rothgerber Christie LLP

(57) ABSTRACT

In an apparatus for manufacturing a display device having a mask assembly, the mask assembly includes: a mask frame comprising an opening; a plurality of first supports spaced apart from each other on the mask frame and each comprising a first center portion crossing the opening in a first direction and a first protrusion protruding from the first center portion in a second direction crossing the first direction; a plurality of second supports spaced apart from each other on the mask frame and each comprising a second center portion crossing the opening in a third direction crossing the first direction and a second protrusion protruding from the second center portion in a fourth direction crossing the third direction; and a mask sheet comprising a plurality of pattern holes and arranged over the mask frame to be supported by the plurality of first supports and the plurality of second supports.

14 Claims, 14 Drawing Sheets

(56) References Cited

U.S. PATENT DOCUMENTS

| | | | |
|---|---|---|---|
| 11,421,314 B2* | 8/2022 | Lee | C23C 14/042 |
| 11,569,487 B2* | 1/2023 | Hong | H10K 71/166 |
| 2017/0207390 A1* | 7/2017 | Kim | C23C 14/24 |
| 2018/0040857 A1* | 2/2018 | Hong | C23C 14/042 |
| 2020/0102636 A1* | 4/2020 | Lee | H10K 71/166 |
| 2021/0020874 A1* | 1/2021 | Hong | H10K 71/166 |
| 2021/0359025 A1* | 11/2021 | Jung | C23C 14/042 |
| 2021/0404049 A1* | 12/2021 | Xu | B05C 17/06 |

FOREIGN PATENT DOCUMENTS

| | | | |
|---|---|---|---|
| KR | 10-2017-0141854 A | 12/2017 | |
| KR | 10-2018-0017301 A | 2/2018 | |

* cited by examiner

METHOD AND APPARATUS FOR MANUFACTURING DISPLAY DEVICE

CROSS-REFERENCE TO RELATED APPLICATION

This application claims priority to and the benefit of Korean Patent Application No. 10-2020-0001576, filed on Jan. 6, 2020, in the Korean Intellectual Property Office, the disclosure of which is incorporated herein in its entirety by reference.

BACKGROUND

1. Field

Aspects of one or more embodiments relate to a method and apparatus for manufacturing a display device.

2. Description of Related Art

As the information society develops, demand for display devices for displaying images has increased. The field of display devices has rapidly changed into flat-panel display (FPD) devices, which are thin, light, and capable of having a relatively large display area, the FPD devices replacing cathode-ray tube displays (CRT displays) which have a relatively large volume. Examples of FPD devices include liquid crystal display (LCD) devices, a plasma display panels (PDPs), organic light-emitting diode (OLED) displays, and electrophoretic display (EPD) devices.

Recently, head-mounted displays (HMD), which a user wears on his or her head to experience augmented reality (AR) or virtual reality (VR), have been developed.

The above information disclosed in this Background section is only for enhancement of understanding of the background and therefore the information discussed in this Background section does not necessarily constitute prior art.

SUMMARY

One or more embodiments include a method and apparatus for manufacturing a display device, the apparatus being capable of manufacturing display devices including various types of display areas.

Additional aspects will be set forth in part in the description which follows and, in part, will be more apparent from the description, or may be learned by practice of the presented example embodiments of the disclosure.

According to one or more example embodiments, an apparatus for manufacturing a display device includes a mask assembly which includes a mask frame including an opening, a plurality of first supports spaced apart from each other on the mask frame and each including a first center portion crossing the opening in a first direction and a first protrusion protruding from the first center portion in a direction crossing the first direction, a plurality of second supports spaced apart from each other on the mask frame and each including a second center portion crossing the opening in a second direction crossing the first direction and a second protrusion protruding from the second center portion in a direction crossing the second direction, and a mask sheet including a plurality of pattern holes and arranged over the mask frame to be supported by the plurality of first supports and the plurality of second supports, wherein the plurality of first supports adjacent to each other and the plurality of second supports adjacent to each other shield a portion of the plurality of pattern holes to define a deposition region.

According to some example embodiments, the first protrusion may include a first portion protruding from the first center portion in the second direction and a second portion protruding from the first center portion in a direction opposite to the second direction.

According to some example embodiments, a first distance from the first center portion to an end of the first portion may be different from a second distance from the first center portion to an end of the second portion.

According to some example embodiments, the first portion and the second portion may each include a curved portion.

According to some example embodiments, a curvature of the first portion and a curvature of the second portion may be different from each other.

According to some example embodiments, the first center portion may further include an alignment opening configured to align locations of the first support and the second support.

According to some example embodiments, the second protrusion may include a third portion protruding from the second center portion and a fourth portion protruding from the second center portion and spaced apart from the third portion in the second direction.

According to some example embodiments, a third distance from the second center portion to an end of the third portion may be the same as a fourth distance from the second center portion to an end of the fourth portion.

According to some example embodiments, the third portion and the fourth portion may each include a curved portion.

According to some example embodiments, a first separation distance between the third portion and the fourth portion may be the same as a maximum width of the first support in the second direction.

According to some example embodiments, a first separation distance between the third portion and the fourth portion may be less than a maximum width of the first support in the second direction.

According to some example embodiments, an end of the third portion and an end of the fourth portion may be connected to each other through a connection portion.

According to some example embodiments, the mask sheet may include a plurality of mask sheets arranged over the mask frame.

According to some example embodiments, the apparatus may further include a source unit facing the mask assembly and configured to supply a deposition material, and a magnetic force unit arranged at an opposite side to the source unit with respect to the mask assembly and configured to direct the mask assembly toward a display substrate.

According to one or more example embodiments, a method of manufacturing a display device includes arranging a mask assembly in a chamber such that the mask assembly faces a source unit configured to supply a deposition material, arranging a display substrate at an opposite side to the source unit with respect to the mask assembly, directing the mask assembly toward the display substrate by using a magnetic force unit, and depositing, on the display substrate, the deposition material sprayed from the source unit and having passed through the mask assembly, wherein the mask assembly includes a mask frame including an opening, a plurality of first supports spaced apart from each other on the mask frame and each including a first center portion crossing the opening in a first direction and a first protrusion protruding from the first center portion in a direction crossing the first direction, a plurality of second supports spaced apart from each other on the mask frame and each including a second center portion crossing the opening in a second direction crossing the first direction and a second protrusion protruding from the second center portion in a direction crossing the second direction, and a mask sheet including a plurality of pattern holes and arranged over the mask frame to be supported by the plurality of first supports and the plurality of second supports, wherein the plurality of first supports adjacent to each other and the plurality of second supports adjacent to each other shield a portion of the plurality of pattern holes to define a deposition region.

According to some example embodiments, the first protrusion may include a first portion protruding from the first center portion in the second direction and a second portion protruding from the first center portion in a direction opposite to the second direction.

According to some example embodiments, a first distance from the first center portion to an end of the first portion may be different from a second distance from the first center portion to an end of the second portion.

According to some example embodiments, the first portion and the second portion may each include a curved portion.

According to some example embodiments, a curvature of the first portion and a curvature of the second portion may be different from each other.

According to some example embodiments, the first center portion may further include an alignment opening configured to align locations of the first support and the second support.

According to some example embodiments, the second protrusion may include a third portion protruding from the second center portion and a fourth portion protruding from the second center portion and spaced apart from the third portion in the second direction.

According to some example embodiments, a third distance from the second center portion to an end of the third portion may be the same as a fourth distance from the second center portion to an end of the fourth portion.

According to some example embodiments, the third portion and the fourth portion may each include a curved portion.

According to some example embodiments, a first separation distance between the third portion and the fourth portion may be the same as a maximum width of the first support in the second direction.

According to some example embodiments, a first separation distance between the third portion and the fourth portion may be less than a maximum width of the first support in the second direction.

According to some example embodiments, an end of the third portion and an end of the fourth portion may be connected to each other through a connection portion.

According to some example embodiments, the mask sheet may include a plurality of mask sheets arranged over the mask frame.

BRIEF DESCRIPTION OF THE DRAWINGS

The above and other aspects, features, and characteristics of certain embodiments of the disclosure will be more apparent from the following description taken in conjunction with the accompanying drawings, in which.

DETAILED DESCRIPTION

Figure 1:
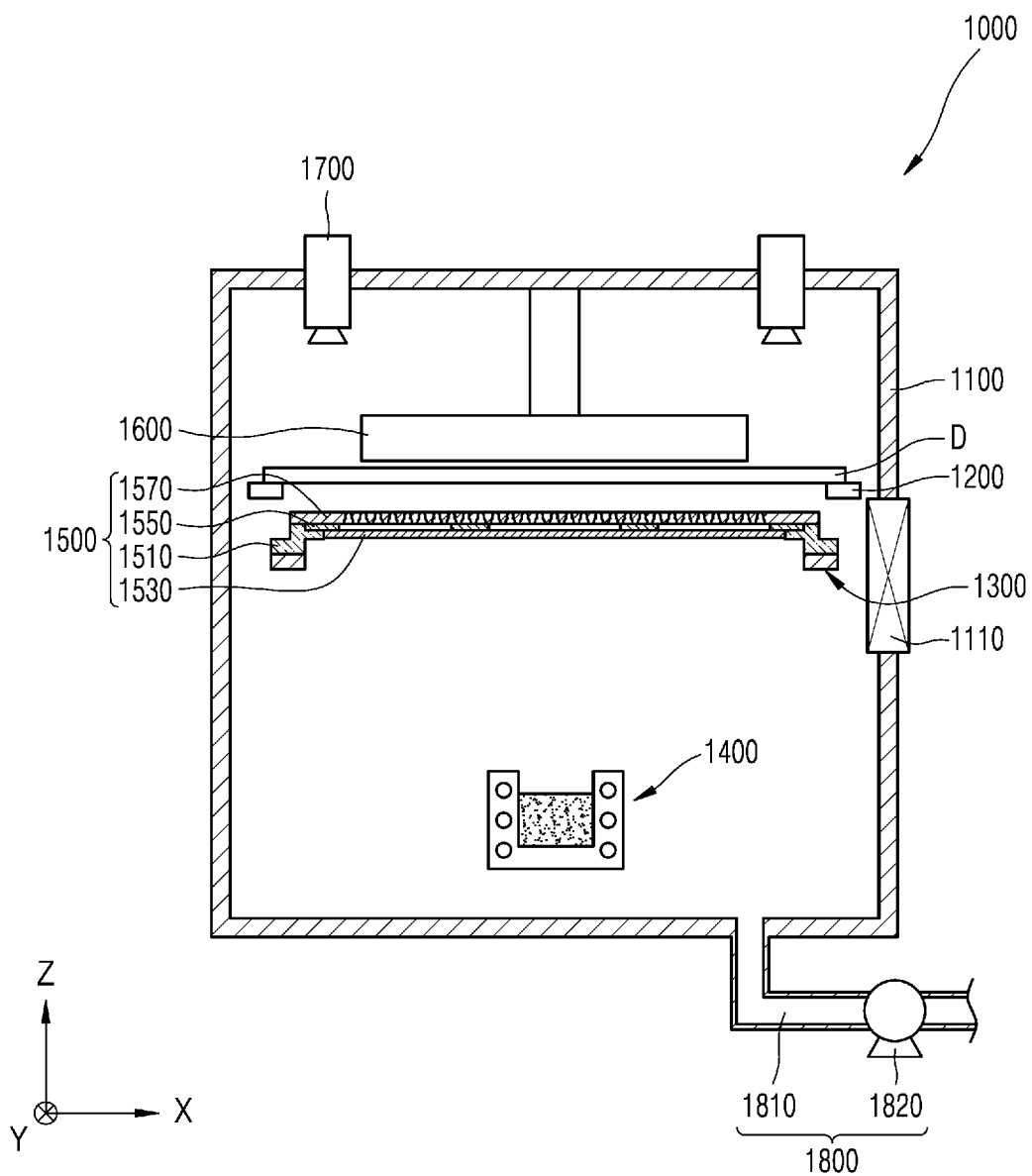
FIG. 1 is a cross-sectional view of an apparatus for manufacturing a display device.

Reference will now be made in more detail to aspects of some example embodiments, examples of which are illustrated in the accompanying drawings, wherein like reference numerals refer to like elements throughout. In this regard, the present example embodiments may have different forms and should not be construed as being limited to the descriptions set forth herein. Accordingly, the example embodiments are merely described below, by referring to the figures, to explain aspects of embodiments according to the present description. As used herein, the term "and/or" includes any and all combinations of one or more of the associated listed items. Throughout the disclosure, the expression "at least one of a, b or c" indicates only a, only b, only c, both a and b, both a and c, both b and c, all of a, b, and c, or variations thereof.

Hereinafter, aspects of some example embodiments will be described in more detail with reference to the accompanying drawings, wherein like reference numerals refer to like elements throughout and some repeated description thereof may be omitted.

While such terms as "first" and "second" may be used to describe various components, such components must not be limited to the above terms. The above terms are used only to distinguish one component from another.

The singular forms "a," "an," and "the" as used herein are intended to include the plural forms as well unless the context clearly indicates otherwise.

It will be understood that the terms "comprise," "comprising," "include" and/or "including" as used herein specify the presence of stated features or components but do not preclude the presence or addition of one or more other features or components.

It will be further understood that, when a layer, region, or component is referred to as being "on" another layer, region, or component, it can be directly or indirectly on the other layer, region, or component. That is, for example, intervening layers, regions, or components may be present.

Sizes of components in the drawings may be exaggerated or reduced for convenience of explanation. For example, since sizes and thicknesses of components in the drawings are arbitrarily illustrated for convenience of explanation, the disclosure is not limited thereto.

When an embodiment may be implemented differently, a certain process order may be performed differently from the described order. For example, two consecutively described processes may be performed substantially at the same time or performed in an order opposite to the described order.

It will be further understood that, when layers, regions, or components are referred to as being "connected" to each other, they may be "directly connected" to each other and/or "indirectly connected" to each other with intervening layers, regions, or components therebetween. For example, when layers, regions, or components are referred to as being "electrically connected" to each other, they may be "directly electrically connected" to each other and/or "indirectly electrically connected" to each other with intervening layers, regions, or components therebetween.

Figure 2:
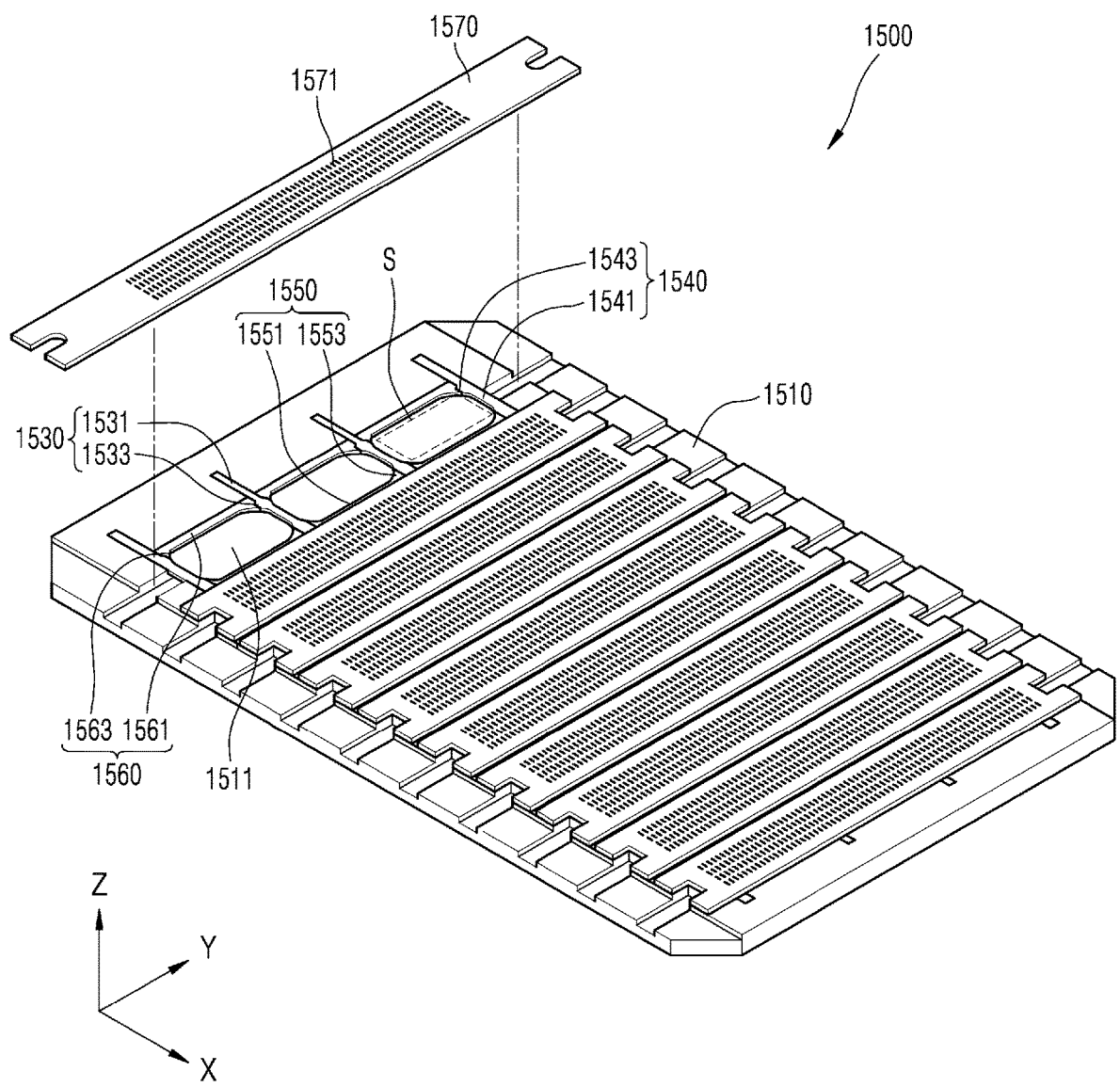
FIG. 2 is a perspective view of a mask assembly according to some example embodiments.

FIG. 1 is a cross-sectional view of an apparatus 1000 for manufacturing a display device. FIG. 2 is a perspective view of a mask assembly 1500 according to some example embodiments.

Referring to FIG. 1, the apparatus 1000 may include a chamber 1100, a substrate support 1200, a mask support 1300, a source unit 1400, a mask assembly 1500, a magnetic force unit 1600, a vision unit 1700, and a pressure adjustor 1800.

The chamber 1100 may include a space therein and may have one side opened to withdraw or receive a display substrate D. In this regard, a shield 1110 including a gate valve may be arranged on an opened portion of the chamber 1100 to selectively open or close the chamber 1100.

The substrate support 1200 may seat the display substrate D thereon and support the display substrate D. In this regard, the substrate support 1200 may support the display substrate D by seating the display substrate D thereon or by adsorbing or attaching to one surface of the display substrate D. According to some example embodiments, the substrate support 1200 may be in the form of a bracket fixed inside the chamber 1100. According to some example embodiments, the substrate support 1200 may be in the form of a shuttle which may seat the display substrate D thereon and may move linearly inside the chamber 1100. Hereinafter, a case in which the substrate support 1200 is in the form of a bracket fixed inside the chamber 1100 will be mainly described in detail for convenience of description.

The mask support 1300 may seat the mask assembly 1500 thereon. In this regard, the mask support 1300 may be inside the chamber 1100. The mask support 1300 may fine-adjust a location of the mask assembly 1500. In this case, the mask support 1300 may include a separate driver or alignment unit for moving the mask assembly 1500 in different directions.

The source unit 1400 may face the mask assembly 1500. In this regard, the source unit 1400 may receive a deposition material, and may evaporate or sublimate a deposition material by applying heat to the deposition material. Accordingly, the source unit 1400 may supply a deposition material.

The mask assembly 1500 may be supported by the mask support 1300. The mask assembly 1500 may include a mask frame 1510, a first support 1530, a second support 1550, and a mask sheet 1570. A detailed description of the mask assembly 1500 will be given below.

The magnetic force unit 1600 may be arranged at an opposite side to the source unit 1400 with respect to the mask assembly 1500. In this regard, the magnetic force unit 1600 may apply force to the mask assembly 1500 through the display substrate D by applying magnetic force to the mask sheet 1570. Particularly, the magnetic force unit 1600 may not only prevent or reduce sagging of the mask sheet 1570 but may also direct the mask sheet 1570 toward the display substrate D. Also, the magnetic force unit 1600 may maintain a uniform interval between the mask sheet 1570 and the display substrate D with respect to a lengthwise direction of the mask sheet 1570.

The vision unit 1700 may be arranged in the chamber 1100 and may capture locations of the display substrate D and the mask assembly 1500. The vision unit 1700 may include a camera for capturing the display substrate D and the mask assembly 1500. Locations of the display substrate D and the mask assembly 1500 may be recognized based on an image captured by the vision unit 1700, and based on the image, a location of the mask assembly 1500 may be fine-adjusted by the mask support 1300.

The pressure adjustor 1800 may be connected to the chamber 1100 and may adjust pressure of the inside of the chamber 1100. For example, the pressure adjustor 1800 may adjust pressure of the inside of the chamber 1100 to a level that is the same as or similar to atmospheric pressure. Also, the pressure adjustor 1800 may adjust pressure of the inside of the chamber 1100 to a level that is the same as or similar to that of a vacuum state.

The pressure adjustor 1800 may include a connection pipe 1810 connected to the chamber 1100 and a pump 1820 mounted on the connection pipe 1810. In this regard, external air may be introduced through the connection pipe 1810 or a gas inside the chamber 1100 may be guided to the outside through the connection pipe 1810 according to an operation of the pump 1820.

Referring to FIG. 2, the mask assembly 1500 may include the mask frame 1510, the first support 1530, the second support 1550, and the mask sheet 1570.

The mask frame 1510 may include an opening 1511. In this regard, a deposition material may pass through the opening 1511. The mask frame 1510 may include a plurality of frames surrounding the opening 1511. The plurality of frames may extend in a first direction (for example, a direction X) or a second direction (for example, a direction Y).

The mask frame 1510 may include a highly rigid metal, which is a material with little deformation.

The first support 1530 may be arranged on the mask frame 1510. The first support 1530 may be fixed to the mask frame 1510 while the first support 1530 is extended. In this regard, the first support 1530 and the mask sheet 1570 may be fixed through welding.

A plurality of first supports 1530 may be arranged on the mask frame 1510 such that the plurality of first supports 1530 are spaced apart from each other. For example, the plurality of first supports 1530 may be spaced apart from each other in the second direction (for example, the direction Y). In this regard, the first support 1530 may prevent or reduce a warpage phenomenon of the mask sheet 1570 due to self-weight and may support the mask frame 1510.

The first support 1530 and the mask sheet 1570 may include different materials from each other. For example, the first support 1530 may include austenitic stainless steels.

The first support 1530 may include a first center portion 1531 and a first protrusion 1533. In this case, the first center portion 1531 and the first protrusion 1533 may be integrally provided.

The first center portion 1531 may be provided in the form of a plate. Also, the first center portion 1531 may cross the opening 1511 in the first direction (for example, the direction X). In this regard, first center portions 1531 included in the plurality of first supports 1530 may be spaced apart from each other in the second direction (for example, the direction Y).

The first protrusion 1533 may protrude from the first center portion 1531 in a direction (for example, the direction Y or a direction −Y) crossing the first direction. In this regard, a plurality of first protrusions 1533 may be arranged in the first direction (for example, the direction X). According to some example embodiments, the plurality of first protrusions 1533 may be arranged at regular intervals in the first direction (for example, the direction X). According to some example embodiments, the plurality of first protrusions 1533 may be arranged at different intervals in the first direction (for example, the direction X). Hereinafter, a case in which the plurality of first protrusions 1533 are arranged at regular intervals in the first direction (for example, the direction X) will be mainly described in detail.

According to some example embodiments, the first protrusion 1533 may protrude from the first center portion 1531 in one direction. According to some example embodiments, the first protrusion 1533 may protrude from the first center portion 1531 in one direction and a direction opposite to the one direction. For example, the first protrusion 1533 may protrude from the first center portion 1531 in the second direction (for example, the direction Y) and a direction (for example, the direction −Y) opposite to the second direction.

The second support 1550 may be arranged on the mask frame 1510. In this regard, the second support 1550 may include the same material as the first support 1530. According to some example embodiments, the second support 1550 may be inserted into the mask frame 1510. According to some example embodiments, the second support 1550 may be arranged on the mask frame 1510 while the second support 1550 is extended. Hereinafter, a case in which the second support 1550 is inserted into the mask frame 1510 will be mainly described in detail.

A plurality of second supports 1550 may be arranged on the mask frame 1510 such that the plurality of second supports 1550 are spaced apart from each other. For example, the plurality of second supports 1550 may be spaced apart from each other in the first direction (for example, the direction X). Particularly, the second support 1550 may be arranged between adjacent mask sheets 1570. Accordingly, the second support 1550 may shield an interval between the mask sheets 1570. The second support 1550 may prevent or reduce a warpage phenomenon of the mask sheet 1570 due to self-weight and may support the mask frame 1510.

The second support 1550 may include a second center portion 1551 and a second protrusion 1553. In this case, the second center portion 1551 and the second protrusion 1553 may be integrally provided.

The second center portion 1551 may cross the opening 1511 in the second direction (for example, the direction Y). In this regard, second center portions 1551 included in the plurality of second supports 1550 may be spaced apart from each other in the first direction (for example, the direction X).

The second protrusion 1553 may protrude from the second center portion 1551 in a direction (for example, the direction X or a direction −X) crossing the second direction. In this regard, a plurality of second protrusions 1553 may be arranged in the second direction (for example, the direction Y). Particularly, the second protrusion 1553 may correspond to the first protrusion 1533.

According to some example embodiments, the second protrusion 1553 may protrude from the second center portion 1551 in one direction. According to some example embodiments, the second protrusion 1553 may protrude from the second center portion 1551 in one direction and a direction opposite to the one direction. For example, the second protrusion 1553 may protrude from the second center portion 1551 in the first direction (for example, the direction X) or a direction (for example, the direction −X) opposite to the first direction.

The mask sheet 1570 may be arranged on the mask frame 1510. Specifically, the mask sheet 1570 may extend in the second direction (for example, the direction Y). In this regard, the mask sheet 1570 may be supported by the plurality of first supports 1530 and the plurality of second supports 1550. Because the mask sheet 1570 is supported by the plurality of first supports 1530 and the plurality of second supports 1550, sagging of the mask sheet 1570 due to self-weight may be prevented or reduced.

The mask sheet 1570 may include stainless steel, Invar, nickel (Ni), cobalt (Co), a nickel alloy, a nickel-cobalt alloy, etc.

According to some example embodiments, a width of the mask sheet 1570 may be less than that of the opening 1511. For example, referring to FIG. 2, a width of the mask sheet 1570 in the first direction (for example, the direction X) may be less than that of the opening 1511 in the first direction (for example, the direction X). Accordingly, a plurality of mask sheets 1570 may be arranged on the mask frame 1510. This may be to prevent or reduce sagging of the mask sheet 1570 due to self-weight. In this regard, the plurality of mask sheets 1570 may be arranged continuously. According to some example embodiments, a width of the mask sheet 1570 may be greater than that of the opening 1511. In this case, for example, a width of the mask sheet 1570 in the first direction (for example, the direction X) may be greater than that of the opening 1511 in the first direction (for example, the direction X). Accordingly, the mask sheet 1570 may be integrally mounted on the mask sheet 1510. Hereinafter, a case in which a width of the mask sheet 1570 is less than that of the opening 1511 will be mainly described in detail for convenience of description.

The mask sheet 1570 may include a plurality of pattern holes 1571. The plurality of pattern holes 1571 may be arranged in the mask sheet 1570 in the first direction (for example, the direction X) or the second direction (for example, the direction Y). For example, the plurality of pattern holes 1571 may be arranged at regular intervals. Also, the plurality of pattern holes 1571 may be entirely arranged in the mask sheet 1570. In such a case, when magnetic force is applied to the mask sheet 1570 by the magnetic force unit 1600 (refer to FIG. 1), uniform magnetic force may be entirely applied to the mask sheet 1570. Accordingly, the mask sheet 1570 may prevent or reduce only a specific portion thereof from being deformed by magnetic force.

The mask assembly 1500 may further include a first outer support 1540 and a second outer support 1560.

The first outer support 1540 may be arranged on the mask frame 1510. Particularly, the first outer support 1540 may be closer to the mask frame 1510 in the second direction (for example, the direction Y) than the first support 1530. Accordingly, the first outer support 1540 may be arranged on a perimeter of the plurality of first supports 1530. In other words, the first outer support 1540 may correspond to a corner of the opening 1511 in the mask frame 1510. Also, the first outer support 1540 may be parallel to the first support 1530.

The first outer support 1540 may include a first outer center portion 1541 and a first outer protrusion 1543. In this case, the first outer center portion 1541 and the first outer protrusion 1543 may be integrally provided. The first outer center portion 1541 and the first outer protrusion 1543 are the same as or similar to the first center portion 1531 and the first protrusion 1533, respectively, and thus, a detailed description thereof is omitted.

The first outer protrusion 1543 may protrude from the first outer center portion 1541 in a direction (for example, the direction Y or the direction −Y) crossing the first direction. According to some example embodiments, the first outer protrusion 1543 may protrude in one direction. For example, the first outer protrusion 1543 may protrude in the second direction (for example, the direction Y) or a direction (for example, the direction −Y) opposite to the second direction. Particularly, the first outer protrusion 1543 may protrude in a direction facing the opening 1511 from the mask frame 1510.

The second outer support 1560 may be arranged on the mask frame 1510. Particularly, the second outer support 1560 may be closer to the mask frame 1510 in the first direction (for example, the direction X) than the second support 1550. Accordingly, the second outer support 1560 may be arranged on a perimeter of the plurality of second supports 1550. In other words, the second outer support 1560 may correspond to a corner of the opening 1511 in the mask frame 1510. Also, the second outer support 1560 may be parallel to the second support 1550.

The second outer support 1560 may include a second outer center portion 1561 and a second outer protrusion 1563. In this case, the second outer center portion 1561 and the second outer protrusion 1563 may be integrally provided. The second outer center portion 1561 and the second outer protrusion 1563 are the same as or similar to the second center portion 1551 and the second protrusion 1553, respectively, and thus, a detailed description thereof is omitted.

The second outer protrusion 1563 may protrude from the second outer center portion 1561 in a direction (for example, the direction X or the direction −X) crossing the second direction. According to some example embodiments, the second outer protrusion 1563 may protrude in one direction. For example, the second outer protrusion 1563 may protrude in the first direction (for example, the direction X) or a direction (for example, the direction −X) opposite to the first direction. Particularly, the second outer protrusion 1563 may protrude in a direction facing the opening 1511 from the mask frame 1510.

According to some example embodiments, a deposition region S may be defined by the plurality of first supports 1530 adjacent to each other and the plurality of second supports 1550 adjacent to each other. In this regard, the plurality of first supports 1530 adjacent to each other and the plurality of second supports 1550 adjacent to each other may shield a portion of the plurality of pattern holes 1571 in the mask sheet 1570.

Similarly, the deposition region S may be defined by the first support 1530 and the first outer support 1540 adjacent to each other and the plurality of second supports 1550 adjacent to each other. As another example, the deposition region S may be defined by the plurality of first supports 1530 adjacent to each other and the second support 1550 and the second outer support 1560 adjacent to each other. As another example, the deposition region S may be defined by the first support 1530 and the first outer support 1540 adjacent to each other and the second support 1550 and the second outer support 1560 adjacent to each other.

The deposition region S may include various shapes according to shapes of a first support (or a first outer support) and a second support (or a second outer support). For example, the deposition region S may include a shape such as a triangle, a polygon, an ellipse, a circle, etc. As another example, the deposition region S may include a curvature.

Figure 3:
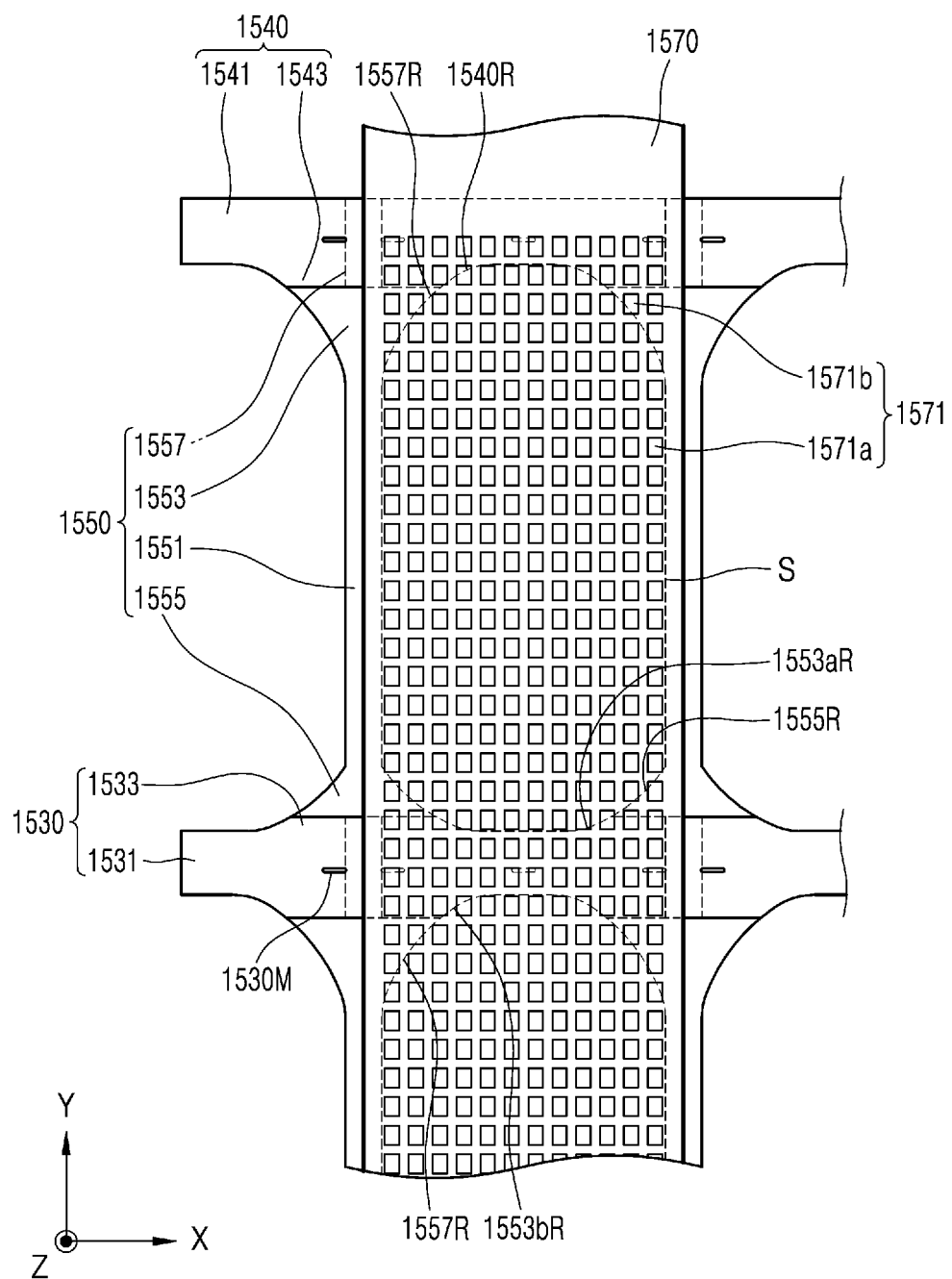
FIG. 3 is a plan view of a first support, a first outer support, a second support, and a mask sheet shown in FIG. 2.
Figure 4A:
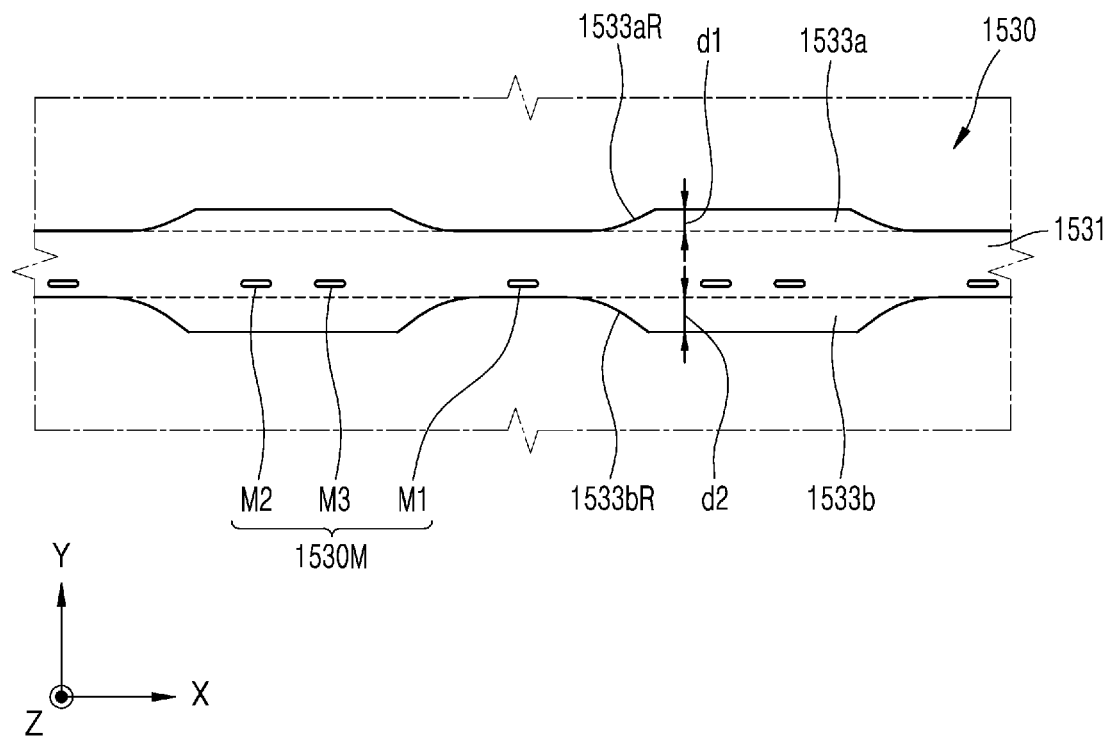
FIG. 4A is a plan view of a first support.
Figure 4B:
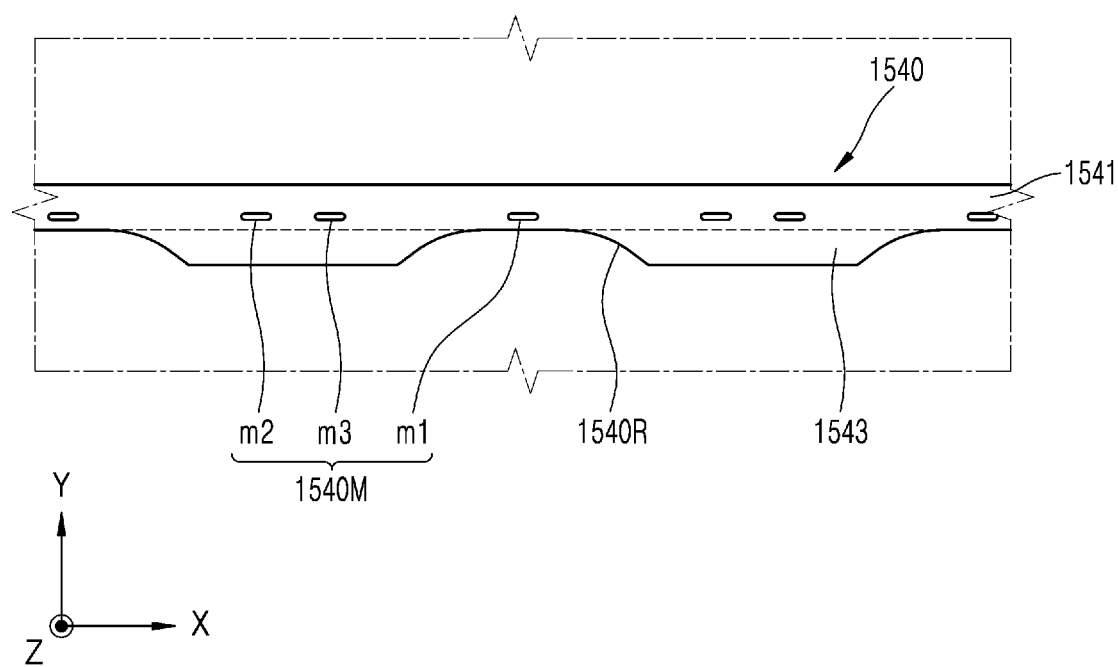
FIG. 4B is a plan view of a first outer support.
Figure 5A:
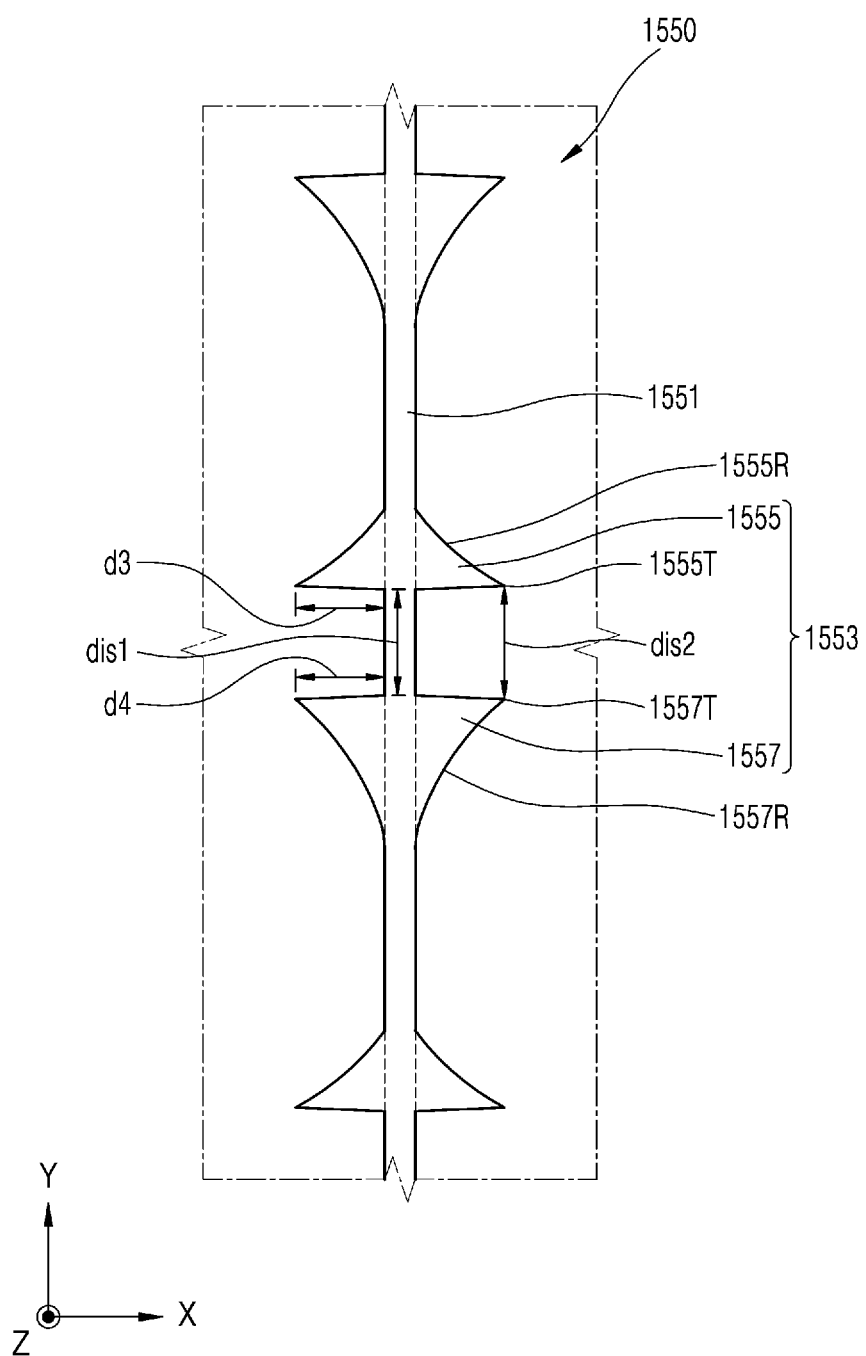
FIG. 5A is a plan view of a second support.
Figure 5B:
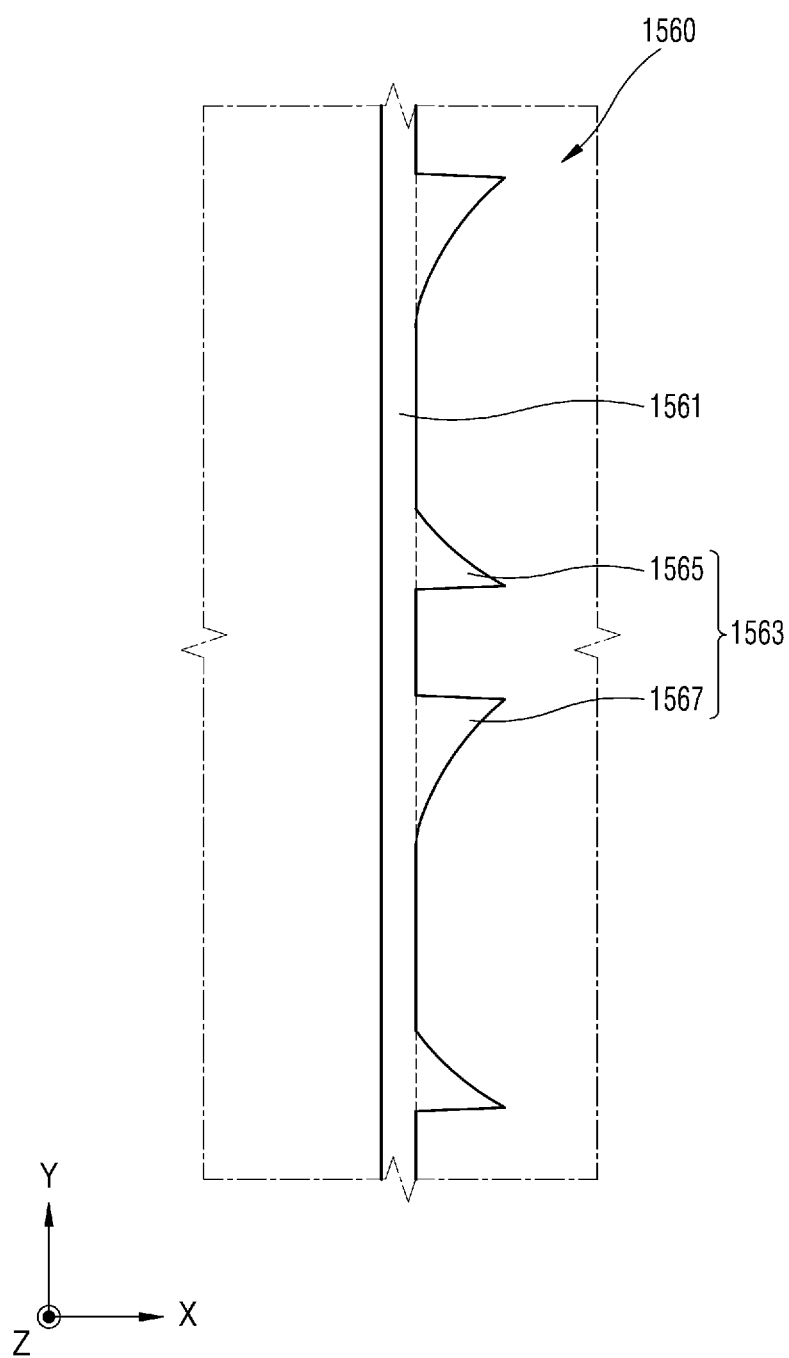
FIG. 5B is a plan view of a second outer support.

FIG. 3 is a plan view of the first support 1530, the first outer support 1540, the second support 1550, and the mask sheet 1570 shown in FIG. 2. FIG. 4A is a plan view of the first support 1530. FIG. 4B is a plan view of the first outer support 1540. FIG. 5A is a plan view of the second support 1550. FIG. 5B is a plan view of the second outer support 1560.

Referring to FIG. 3, a mask assembly may include a mask frame, the first support 1530, the first outer support 1540, the second support 1550, a second outer support, and the mask sheet 1570. In this case, the first support 1530 and the first outer support 1540 adjacent to each other and the plurality of second supports 1550 adjacent to each other may define the deposition region S.

The mask sheet 1570 may include the plurality of pattern holes 1571. The plurality of pattern holes 1571 may be arranged in the mask sheet 1570 in the first direction (for example, the direction X) or the second direction (for example, the direction Y). In this regard, the plurality of pattern holes 1571 may include a first pattern hole 1571a inside the deposition region S and a second pattern hole 1571b at the edge of the deposition region S.

Referring to FIGS. 3 and 4A, the first support 1530 may include the first center portion 1531 and the first protrusion 1533.

The first center portion 1531 may extend in the first direction (for example, the direction X). In this case, the first center portion 1531 may include an alignment opening 1530M for aligning locations of the first support 1530 and the second support 1550. The alignment opening 1530M may include a first opening M1, a second opening M2, and a third opening M3.

The first opening M1 may correspond between the plurality of first protrusions 1533. Accordingly, whether the first support 1530 is accurately aligned or not may be checked.

The second opening M2 and the third opening M3 may be arranged with the second center portion 1551 therebetween and may correspond to the first protrusion 1533. Accordingly, whether the second support 1550 is accurately aligned to correspond to the first support 1530 or not may be checked.

According to some example embodiments, the first protrusion 1533 may include a first portion 1533a and a second portion 1533b. The first portion 1533a may protrude from the first center portion 1531 in the second direction (for example, the direction Y), and the second portion 1533b may protrude from the first center portion 1531 in a direction (for example, the direction −Y) opposite to the second direction. In this case, the first portion 1533a and the second portion 1533b may correspond to each other.

According to some example embodiments, a first distance d1 from the first center portion 1531 to an end of the first portion 1533a may be different from a second distance d2 from the first center portion 1531 to an end of the second portion 1533b. In this regard, the first distance d1 may be defined as a maximum distance from a boundary between the first center portion 1531 and the first portion 1533a to an end of the first portion 1533a. Similarly, the second distance d2 may be defined as a maximum distance from a boundary between the first center portion 1531 and the second portion 1533b to an end of the second portion 1533b.

According to some example embodiments, the first portion 1533a or the second portion 1533b may include a curved portion. For example, the first portion 1533a may include a first curved portion 1533aR, and the second portion 1533b may include a second curved portion 1533bR. According to some example embodiments, the first portion 1533a or the second portion 1533b may include only a straight portion. For example, the first portion 1533a or the second portion 1533b may be polygonal. However, for convenience of description, a case in which the first portion 1533a includes the first curved portion 1533aR and the second portion 1533b includes the second curved portion 1533bR will be mainly described in detail below.

According to some example embodiments, a curvature of the first curved portion 1533aR and a curvature of the second curved portion 1533bR may be different from each other. Also, a radius of curvature of the first curved portion 1533aR may be different from a radius of curvature of the second curved portion 1533bR. According to some example embodiments, a curvature of the first curved portion 1533aR and a curvature of the second curved portion 1533bR may be the same as each other. Also, a radius of curvature of the first curved portion 1533aR may be the same as a radius of curvature of the second curved portion 1533bR. However, for convenience of description, a case in which a curvature of the first curved portion 1533aR is different from a curvature of the second curved portion 1533bR will be mainly described in detail.

Referring to FIGS. 3 and 4B, the first outer support 1540 may include the first outer center portion 1541 and the first outer protrusion 1543. The first outer center portion 1541 may include an outer opening 1540M for aligning locations of the first outer center portion 1541 and the second support 1550. The outer opening 1540M may include a first outer opening m1, a second outer opening m2, and a third outer opening m3.

The first outer center portion 1541, the first outer opening m1, the second outer opening m2, and the third outer opening m3 of FIG. 4B are the same as or similar to the first center portion 1531, the first opening M1, the second opening M2, and the third opening M3 of FIG. 4A, and thus, a detailed description thereof is omitted.

The first outer protrusion 1543 may protrude from the first outer center portion 1541 in one direction. FIG. 4B shows a case in which the first outer protrusion 1543 protrudes in a direction (for example, the direction −Y) opposite to the second direction. According to some example embodiments, the first outer protrusion 1543 may include a first outer curved portion 1540R. In this case, the first outer curved portion 1540R may include the same curvature as the first curved portion 1533aR or the second curved portion 1533bR. According to some example embodiments, the first outer protrusion 1543 may include only a straight portion. In this case, the first outer protrusion 1543 may be polygonal. Hereinafter, for convenience of description, a case in which the first outer protrusion 1543 includes the first outer curved portion 1540R will be mainly described in detail.

Referring to FIGS. 3 and 5A, the second support 1550 may include the second center portion 1551 and the second protrusion 1553. In this case, the second center portion 1551 may extend in the second direction (for example, the direction Y), and the second protrusion 1553 may protrude from the second center portion 1551 in a direction (for example, the direction X) crossing the second direction.

According to some example embodiments, the second protrusion 1553 may be symmetrically arranged with respect to the second center portion 1551. For example, with respect to the second center portion 1551, the second protrusion 1553 may protrude in the first direction (for example, the direction X) and a direction (for example, the direction −X) opposite to the first direction. Accordingly, deposition regions S defined by the first support 1530 and the second support 1550 may have a certain shape.

According to some example embodiments, the second protrusion 1553 may include a third portion 1555 and a fourth portion 1557 spaced apart from the third portion 1555 in the second direction. In this case, the third portion 1555 and the fourth portion 1557 may be alternately arranged on the second center portion 1551. Specifically, the third portion 1555 and the fourth portion 1557 may be alternately arranged in the second direction. Accordingly, the deposition regions S defined by the plurality of first supports 1530 adjacent to each other and the plurality of second supports 1550 adjacent to each other may have a certain shape.

According to some example embodiments, a third distance d3 from the second center portion 1551 to an end of the third portion 1555 may be the same as a fourth distance d4 from the second center portion 1551 to an end of the fourth portion 1557. In this regard, the third distance d3 may be defined as a maximum distance from a boundary between the second center portion 1551 and the third portion 1555 to an end of the third portion 1555. Similarly, the fourth distance d4 may be defined as a maximum distance from a boundary between the second center portion 1551 and the fourth portion 1557 to an end of the fourth portion 1557. Particularly, in a case in which the first distance d1 (refer to FIG. 4A) and the second distance d2 (refer to FIG. 4A) are different from each other in the first support 1530, sagging of the second protrusion 1553 due to self-weight or deformation of the second protrusion 1553 due to tensile force may be reduced when the third distance d3 and the fourth distance d4 are the same as each other. According to some example embodiments, the third distance d3 may be different from the fourth distance d4. However, for convenience of description, a case in which the third distance d3 and the fourth distance d4 are the same as each other will be mainly described in detail.

According to some example embodiments, the third portion 1555 or the fourth portion 1557 may include a curved portion. For example, the third portion 1555 may include a third curved portion 1555R, and the fourth portion 1557 may include a fourth curved portion 1557R. According to some example embodiments, the third portion 1555 or the fourth portion 1557 may include only a straight portion. For example, the third portion 1555 or the fourth portion 1557 may be polygonal. However, for convenience of description, a case in which the third portion 1555 includes the third curved portion 1555R and the fourth portion 1557 includes the fourth curved portion 1557R will be mainly described in detail.

According to some example embodiments, a curvature of the third curved portion 1555R and a curvature of the fourth curved portion 1557R may be different from each other. Also, a radius of curvature of the third curved portion 1555R may be different from a radius of curvature of the fourth curved portion 1557R. In this case, the curvature of the third curved portion 1555R may be the same as a curvature of the first curved portion 1553aR. Also, the curvature of the fourth curved portion 1557R may be the same as a curvature of the second curved portion 1553bR. Similarly, the curvature of the fourth curved portion 1557R may be the same as a curvature of the first outer curved portion 1540R. Accordingly, a curved portion of the deposition region S may be continuous due to the first support 1530 and the second support 1550. For example, a curvature of the first curved portion 1553aR and a curvature of the third curved portion 1555R are the same as each other, and thus, a curved portion of the deposition region S may be continuous.

As described above, when a curvature of the third curved portion 1555R and a curvature of the first curved portion 1553aR are the same as each other, a first separation distance dis1 between the third portion 1555 and the fourth portion 1557 may be the same as a maximum width of the first support 1530 in the second direction (for example, the direction Y). In this regard, the first separation distance dis1 between the third portion 1555 and the fourth portion 1557 may correspond between adjacent deposition regions S, and the first separation distance dis1 refers to a minimum distance spaced between the third portion 1555 and the fourth portion 1557. Also, a second separation distance dis2 between an end 1555T of the third portion 1555 and an end 1557T of the fourth portion 1557 may be the same as the first separation distance dis1. According to some example embodiments, the first separation distance dis1 and the second separation distance dis2 may be different from each other.

Referring to FIG. 5B, the second outer support 1560 may include the second outer center portion 1561 and the second outer protrusion 1563. The second outer protrusion 1563 may include a third outer portion 1565 and a fourth outer portion 1567 spaced apart therefrom in the second direction (for example, the direction Y). The second outer center portion 1561, the third outer portion 1565, and the fourth outer portion 1567 of FIG. 5B are the same as or similar to the second center portion 1551, the third portion 1555, and the fourth portion 1557 of FIG. 5A, respectively, and thus, a detailed description thereof is omitted.

According to some example embodiments, the third outer portion 1565 and the fourth outer portion 1567 may be arranged on one side of the second outer center portion 1561. For example, both of the third outer portion 1565 and the fourth outer portion 1567 may protrude in the first direction (for example, the direction X). As another example, both of the third outer portion 1565 and the fourth outer portion 1567 may protrude in a direction (for example, the direction −X) opposite to the first direction.

A portion of the plurality of pattern holes 1571 in the mask sheet 1570 may be shielded by the first support 1530 and the second support 1550 described above. Accordingly, the deposition region S may have various shapes. For example, the deposition region S may include a curved portion. As another example, the deposition region S may have a shape such as a triangle, a polygon, an ellipse, a circle, etc.

According to some example embodiments, the first support 1530 may include the first protrusion 1533, and the second support 1550 may include the second protrusion 1553. Accordingly, sagging of the first support 1530 and the second support 1550 due to self-weight may be reduced, and deposition efficiency and deposition precision may be increased.

Figure 6A:
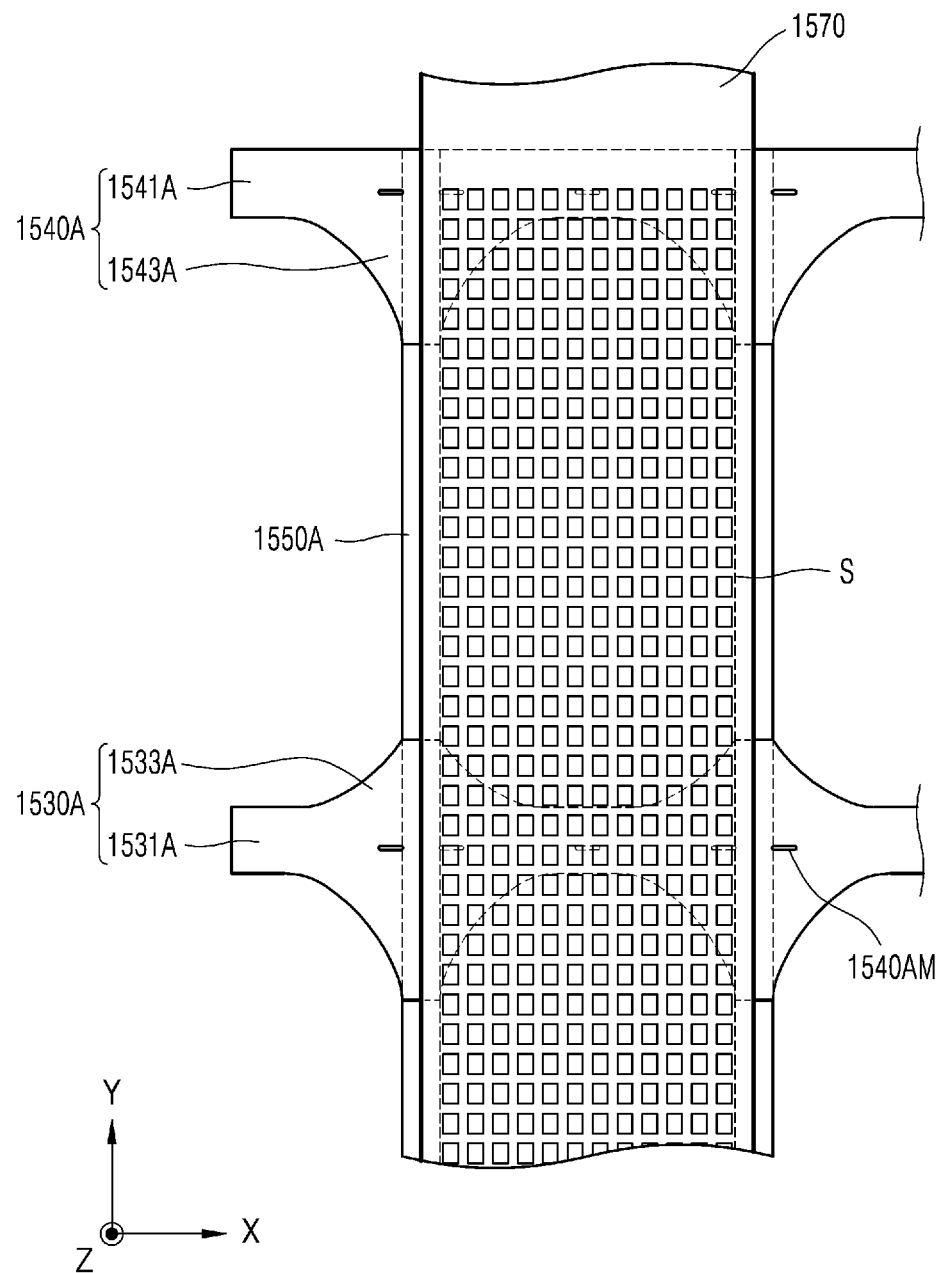
FIGS. 6A and 6B are comparative examples for comparison with an embodiment.

As shown in FIG. 6A, when a first support 1530A includes a first protrusion 1533A, and a second support 1550A includes no second protrusion, the first protrusion 1533A may protrude further to maintain a shape of the deposition region S. In this case, a deformation amount of the mask sheet 1570 may be a maximum of 17.9 um as demonstrated by simulation results. In this regard, the deformation amount refers to a maximum value of a distance by which an upper surface of the mask sheet 1570 is distorted from an upper surface of the initial mask sheet 1570 when the mask sheet 1570 is fixed to a first support 1530A and a second support 1550A. However, according to some example embodiments, as a result of simulation under the same condition as a comparative example of FIG. 6A, a deformation amount of the mask sheet 1570 may be a maximum of 8.7 um. That is, according to some example embodiments, a deformation amount of the mask sheet 1570 may be reduced by about 51%. Accordingly, according to some example embodiments, deformation or sagging of the mask sheet 1570 may be reduced compared to the comparative example of FIG. 6A, and thus, deposition efficiency and precision of deposition may be increased.

Figure 6B:
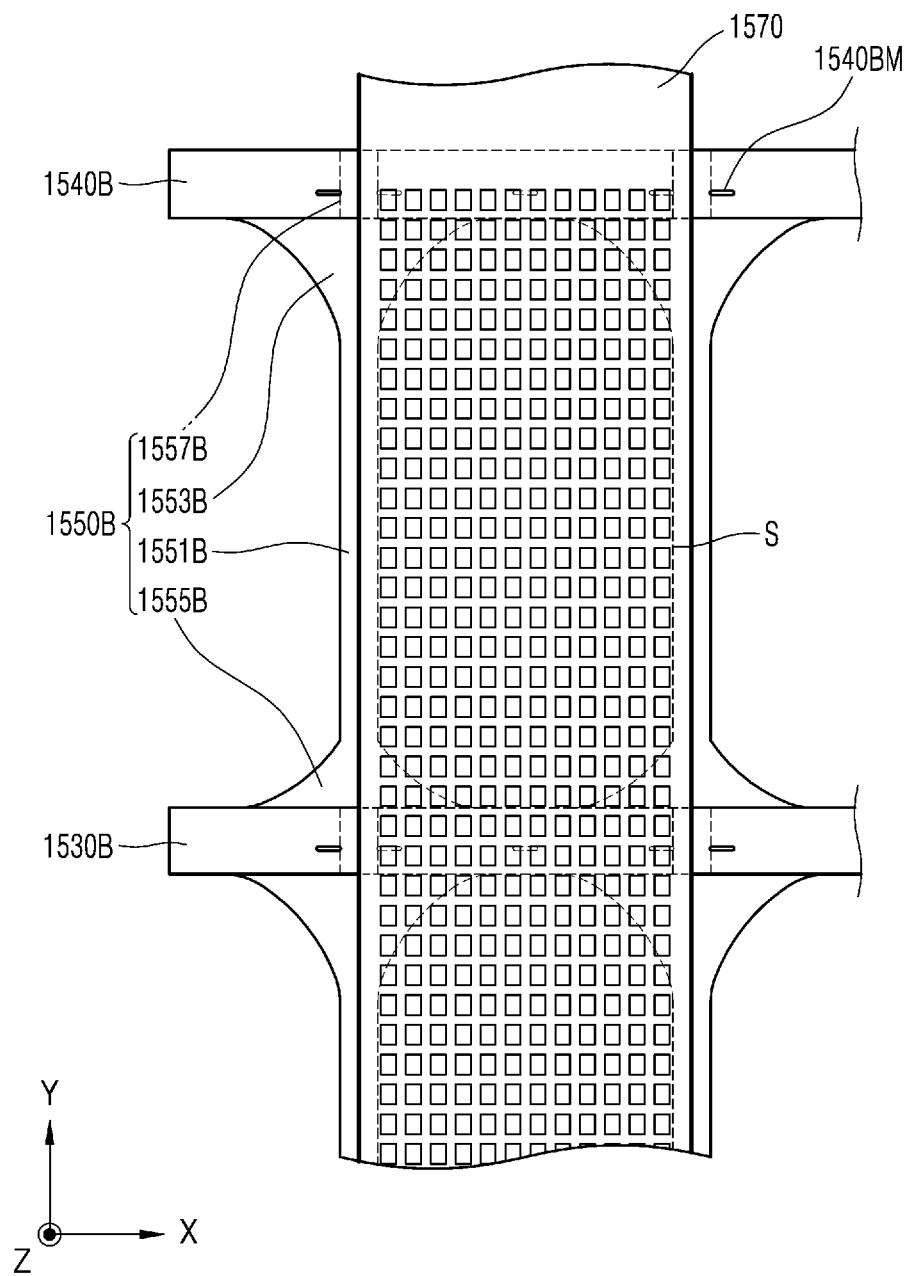

As shown in FIG. 6B, when a first support 1530B includes no first protrusion, and a second support 1550B includes a second protrusion 1553B, the second protrusion 1553B may protrude further to maintain a shape of the deposition region S. In this case, sagging of the second support 1550B due to self-weight of the second protrusion 1553B or deformation of the second protrusion 1553B due to a tensile force applied to the second support 1550B may increase, and as a result, deposition efficiency and precision of deposition may decrease.

For example, in a comparative example of FIG. 6B, a sagging amount of the second support 1550B may be 260 um as a result of simulation. In this regard, the sagging amount refers to a maximum value of a distance by which an upper surface of the second protrusion 1553B is bent from an upper surface of the initial second protrusion 1553B when a tensile force of about 4.2 kgf is applied to the second support 1550B. However, according to some example embodiments, as a result of simulation performed when a second support has the same thickness as that in the comparative example of FIG. 6B and a tensile force within the margin of error is applied, a sagging amount of the second support 1550 (refer to FIG. 3) may be 88 um. That is, according to some example embodiments, a sagging amount of the second support 1550 may be reduced by about 51%.

For example, if a tensile force of about 10 kgf is applied to a second outer support, a sagging amount of the second outer support may be 1370 um as demonstrated in simulation results. However, according to some example embodiments, as a result of simulation performed when a second support has the same thickness as that in the comparative example of FIG. 6B and a tensile force within the margin of error is applied, a sagging amount of the second outer support 1560 (refer to FIG. 4B) may be 217 um. That is, according to some example embodiments, a sagging amount of the second outer support 1560 may be reduced by about 84%.

Accordingly, according to some example embodiments, deformation and sagging of a first support may be reduced compared to the comparative example of FIG. 6B, and thus, deposition efficiency and precision of deposition may be increased. In other words, a shadow phenomenon due to a protrusion may be prevented or reduced.

Figure 7A:
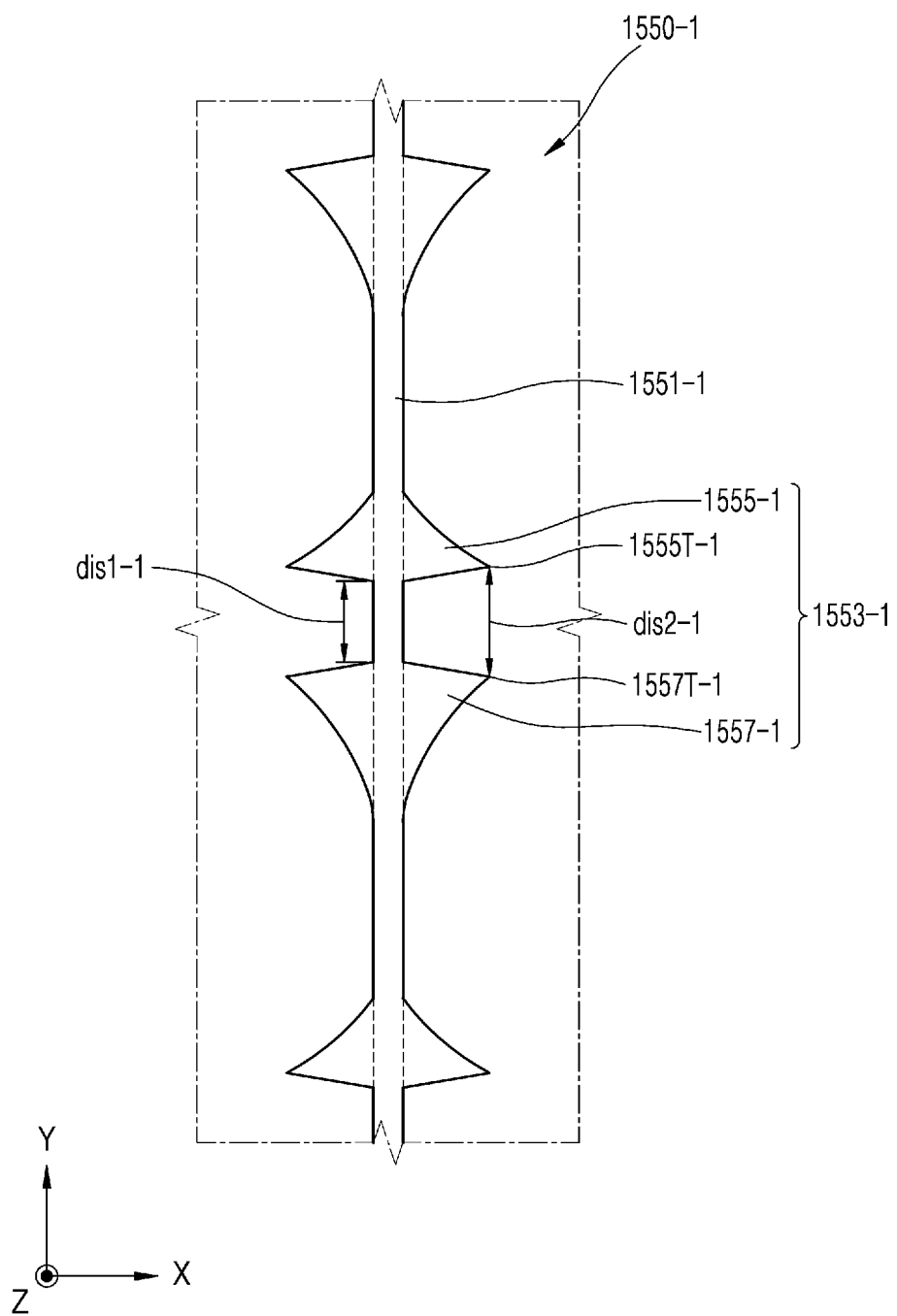
FIG. 7A is a plan view of a second support according to some example embodiments.
Figure 7B:
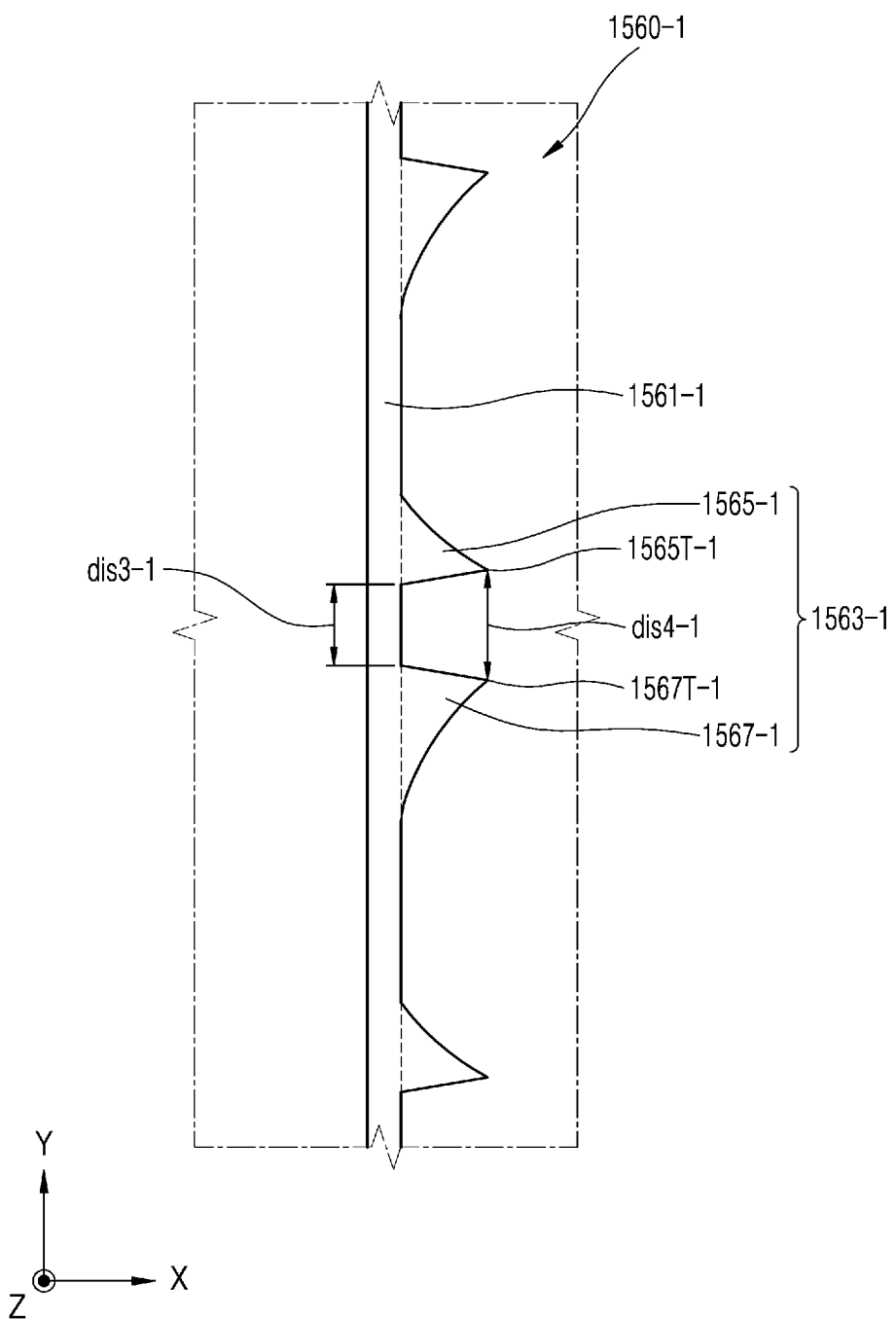
FIG. 7B is a plan view of a second outer support according to some example embodiments.

FIG. 7A is a plan view of a second support 1550-1 according to some example embodiments. FIG. 7B is a plan view of a second outer support 1560-1 according to some example embodiments.

Referring to FIG. 7A, the second support 1550-1 may include a second center portion 1551-1 and a second protrusion 1553-1. The second protrusion 1553-1 may include a third portion 1555-1 and a fourth portion 1557-1. The second center portion 1551-1, the third portion 1555-1, and the fourth portion 1557-1 of FIG. 7A are the same as or similar to the second center portion 1551, the third portion 1555, and the fourth portion 1557 of FIG. 5A, and thus, a repeated description thereof is omitted.

According to some example embodiments, a first separation distance dis1-1 between the third portion 1555-1 and the fourth portion 1557-1 may be less than a maximum width of the first support 1530 (refer to FIG. 3) in the second direction (for example, the direction Y). In this regard, the first separation distance dis1-1 refers to a minimum distance spaced between the third portion 1555-1 and the fourth portion 1557-1. In this case, a second separation distance dis2-1 between an end 1555T-1 of the third portion 1555-1 and an end 1557T-1 of the fourth portion 1557-1 may be greater than the first separation distance dis1-1.

According to some example embodiments, a portion where the second protrusion 1553-1 is in contact with the second center portion 1551-1 may be expanded. Accordingly, deposition efficiency and precision of deposition may be increased.

Referring to FIG. 7B, the second outer support 1560-1 may include a second outer center portion 1561-1 and a second outer protrusion 1563-1. The second outer protrusion 1563-1 may include a third outer portion 1565-1 and a fourth outer portion 1567-1. The second outer center portion 1561-1, the third outer portion 1565-1, and the fourth outer portion 1567-1 of FIG. 7B are the same as or similar to the second outer center portion 1561, the third outer portion 1565, and the fourth outer portion 1567 of FIG. 5B, and thus, a repeated description thereof is omitted.

According to some example embodiments, a third separation distance dis3-1 between the third outer portion 1565-1 and the fourth outer portion 1567-1 may be less than a maximum width of the first support 1530 (refer to FIG. 3) in the second direction (for example, the direction Y). In this regard, the third separation distance dis3-1 refers to a minimum distance spaced between the third outer portion 1565-1 and the fourth outer portion 1567-1. In this case, a fourth separation distance dis4-1 between an end 1565T-1 of the third outer portion 1565-1 and an end 1567T-1 of the fourth outer portion 1567-1 may be greater than the third separation distance dis3-1.

Figure 8A:
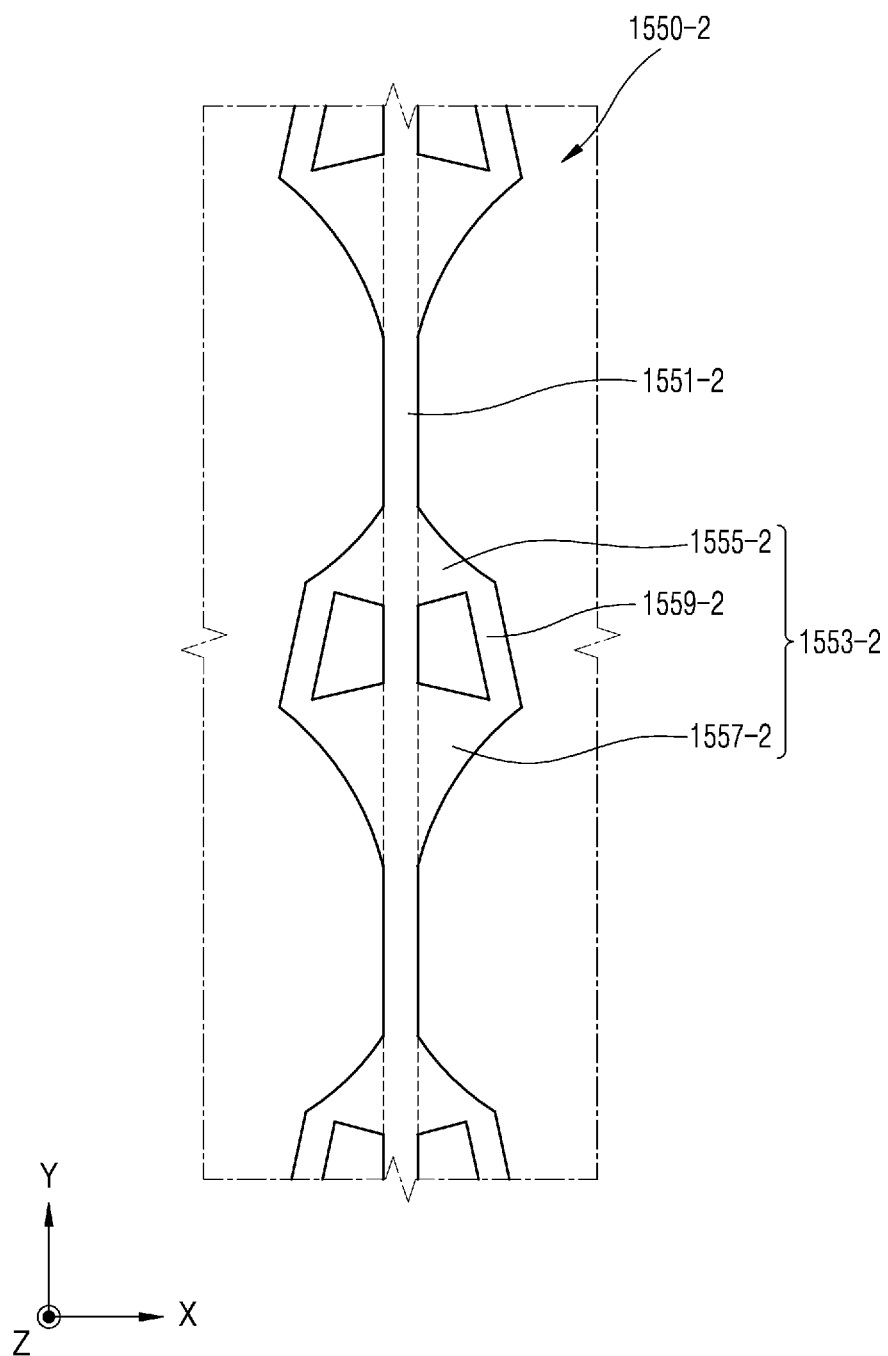
FIG. 8A is a plan view of a second support according to some example embodiments.
Figure 8B:
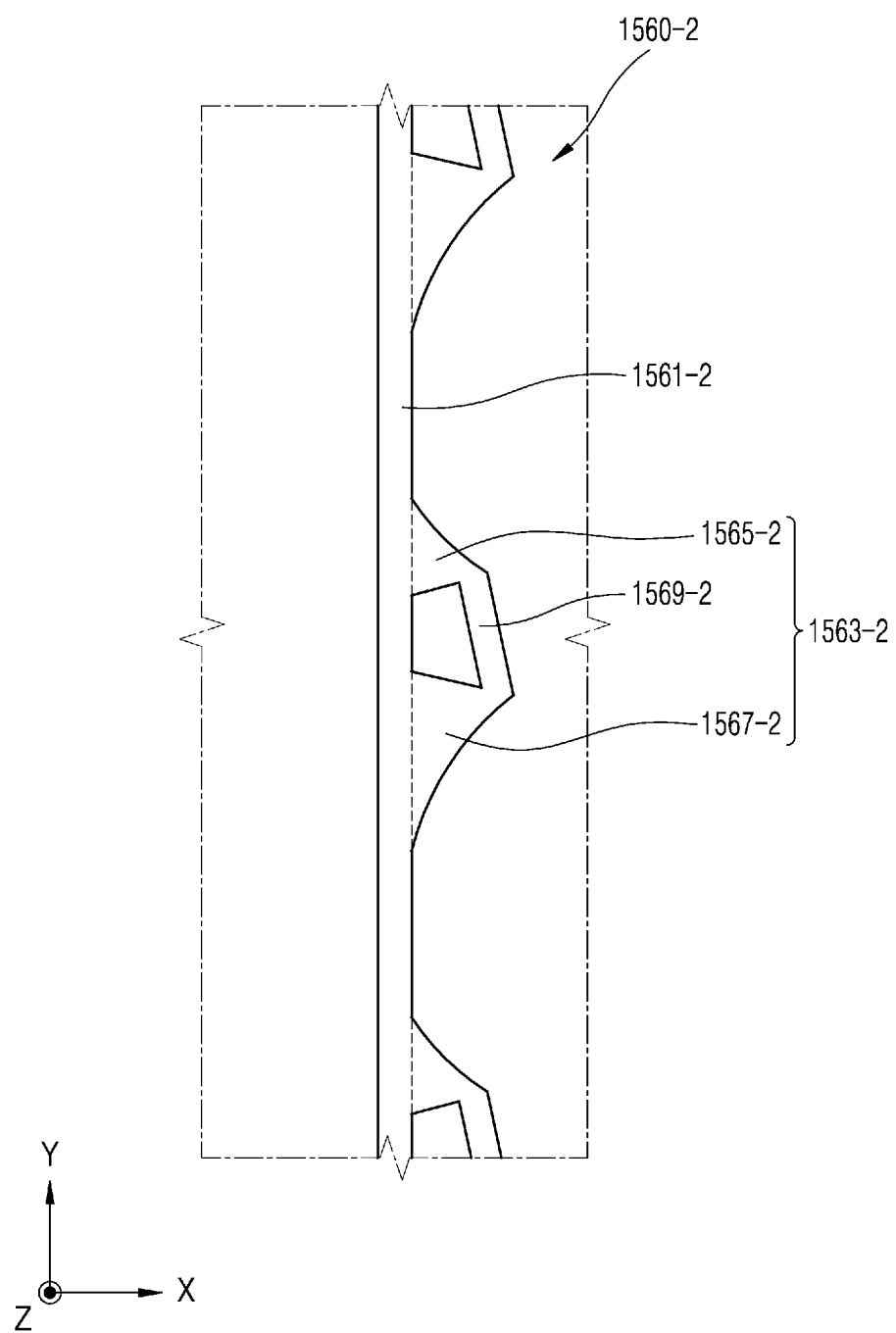
FIG. 8B is a plan view of a second outer support according to some example embodiments.

FIG. 8A is a plan view of a second support 1550-2 according to some example embodiments. FIG. 8B is a plan view of a second outer support 1560-2 according to some example embodiments.

Referring to FIG. 8A, the second support 1550-2 may include a second center portion 1551-2 and a second protrusion 1553-2. The second protrusion 1553-2 may include a third portion 1555-2 and a fourth portion 1557-2. The second center portion 1551-2, the third portion 1555-2, and the fourth portion 1557-2 of FIG. 8A are the same as or similar to the second center portion 1551-1, the third portion 1555-1, and the fourth portion 1557-1 of FIG. 7A, and thus, a repeated description thereof is omitted.

According to some example embodiments, an end of the third portion 1555-2 and an end of the fourth portion 1557-2 may be connected to each other through a connection portion 1559-2. Accordingly, the third portion 1555-2 and the fourth portion 1557-2 may be supported by each other.

Referring to FIG. 8B, the second outer support 1560-2 may include a second outer center portion 1561-2 and a second outer protrusion 1563-2. The second outer protrusion 1563-2 may include a third outer portion 1565-2 and a fourth outer portion 1567-2. The second outer center portion 1561-2, the third outer portion 1565-2, and the fourth outer portion 1567-2 of FIG. 8B are the same as or similar to the second outer center portion 1561-1, the third outer portion 1565-1, and the fourth outer portion 1567-1 of FIG. 7B, and thus, a repeated description thereof is omitted.

According to some example embodiments, an end of the third outer portion 1565-2 and an end of the fourth outer portion 1567-2 may be connected to each other through a connection portion 1569-2.

Referring to FIG. 1 again, the apparatus 1000 described above may be used to manufacture a display device which will be described in more detail below. Specifically, when the pressure adjustor 1800 adjusts pressure of the inside of the chamber 1100 to a level that is the same as or similar to atmospheric pressure, a gate valve may operate to open the chamber 1100.

After that, the display substrate D may be inserted from the outside of the chamber 1100 to the inside of the chamber 1100. In this regard, the display substrate D may be inserted into the chamber 1100 in various ways. According to some example embodiments, the display substrate D may be inserted from the outside of the chamber 1100 to the inside of the chamber 1100 via a robot arm, etc. arranged outside the chamber 1100. According to some example embodiments, when the substrate support 1200 has a shuttle form, the substrate support 1200 may be carried out from the inside of the chamber 1100 to the outside of the chamber 1100, and then, the display substrate D may be seated on the substrate support 1200 via a separate robot arm, etc. arranged outside the chamber 1100 and the substrate support 1200 may be inserted from the outside of the chamber 1100 to the inside of the chamber 1100.

According to some example embodiments, the mask assembly 1500 may be inside the chamber 1100. According to some example embodiments, like or similar to the display substrate D, the mask assembly 1500 may be inserted from the outside of the chamber 1100 to the inside of the chamber 1100. In this case, the mask assembly 1500 may be arranged in the chamber 1100 to face the source unit 1400 for supplying a deposition material.

When the display substrate D is inserted to the inside of the chamber 1100, the display substrate D may be seated on the substrate support 1200. In this case, the display substrate D may be arranged at an opposite side to the source unit 1400 with respect to the mask assembly 1500. In this regard, the vision unit 1700 may capture locations of the display substrate D and the mask assembly 1500. Particularly, the vision unit 1700 may capture a first align mark of the display substrate D and a second align mark of the mask assembly 1500.

Locations of the display substrate D and the mask assembly 1500 may be recognized based on the first align mark and the second align mark captured as described above. Specifically, the second align mark may be the alignment opening 1530M of the first support 1530. In this regard, the apparatus 1000 may include a separate controller and may recognize locations of the display substrate D and the mask assembly 1500.

When locations of the display substrate D and the mask assembly 1500 have been recognized, the mask support 1300 may fine-adjust a location of the mask assembly 1500.

After that, the magnetic force unit 1600 may be used to direct the mask assembly 1500 toward the display substrate D.

After that, the source unit 1400 may operate and supply a deposition material to the mask assembly 1500, and the deposition material having passed through the plurality of pattern holes 1571 of the mask assembly 1500 may be deposited on the display substrate D. In this regard, the pump 1820 may maintain pressure of the inside of the chamber 1100 at a level that is the same as or similar to that of a vacuum state, thereby drawing out a gas of the inside of the chamber 1100 and discharging the same.

In the above case, the deposition material may pass through the first pattern hole 1571a in the deposition region S and may be deposited on the display substrate D. Also, the deposition material may pass through a portion of the second pattern hole 1571b at the edge of the deposition region S and may be deposited on the display substrate D. In this case, the deposition region S may have various shapes.

Accordingly, the apparatus 1000 for manufacturing a display device and a method of manufacturing a display device allow the manufacture of a display device including a display area having various shapes.

Hereinafter, a display device manufactured through the apparatus 1000 for manufacturing a display device and the method of manufacturing a display device will be described in detail.

Figure 9:
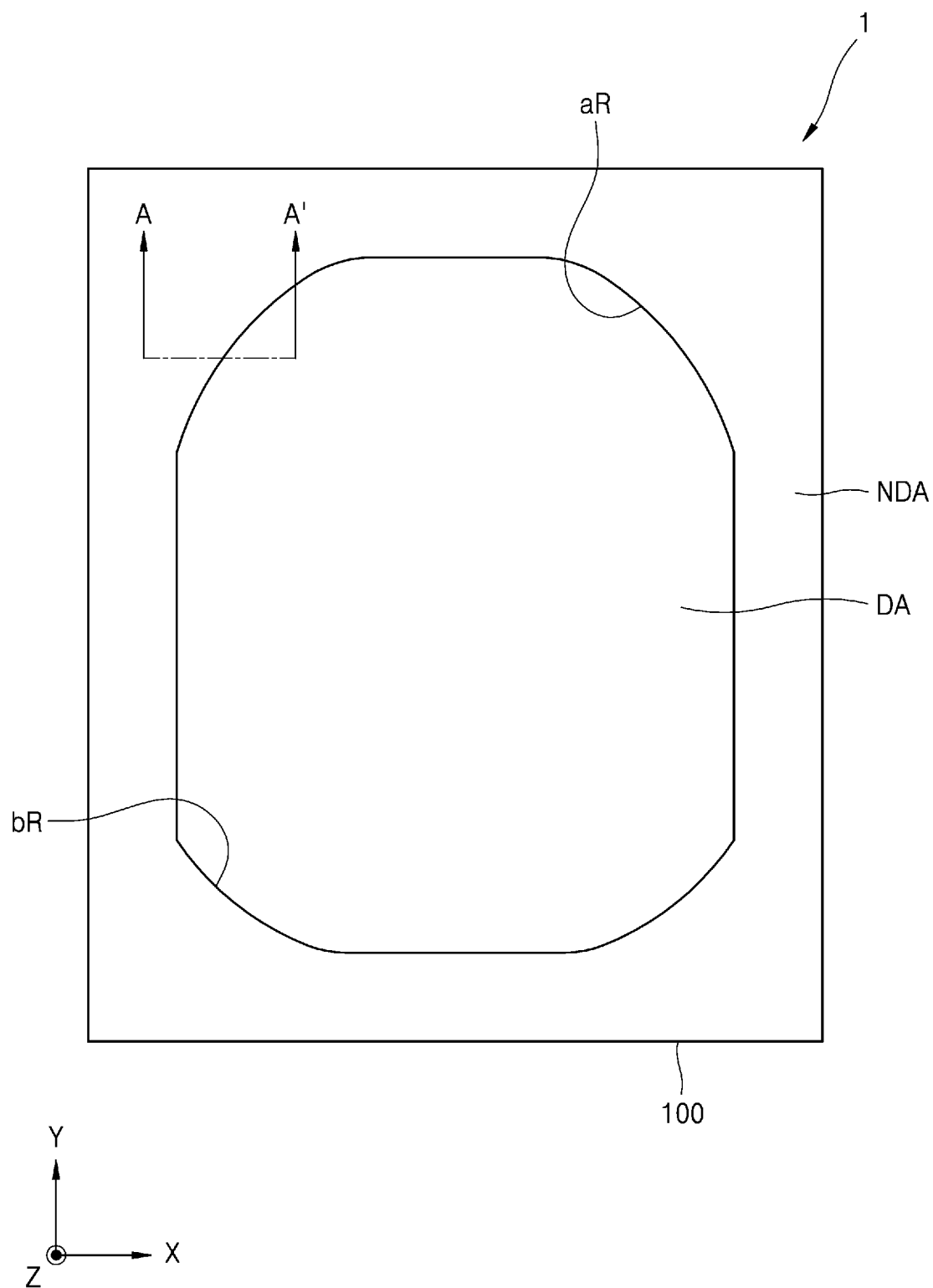
FIG. 9 is a plan view of a display device manufactured through the apparatus shown in FIG. 1.

FIG. 9 is a plan view of a display device 1 manufactured through the apparatus 1000 shown in FIG. 1.

Referring to FIG. 9, the display device 1 may have a display area DA and a non-display area NDA around the display area DA defined in a substrate 100. An emission portion may be arranged in the display area DA, and power wiring, etc. may be arranged in the non-display area NDA. Also, a pad portion may be arranged in the non-display area NDA.

The display device 1 manufactured through an apparatus for manufacturing a display device according to some example embodiments may have the display area DA in various shapes. For example, the display area DA may include a curved portion. As another example, the display area DA may have a polygonal shape including only a straight portion. Hereinafter, a case in which the display area DA includes a curved portion will be mainly described in detail.

The display area DA may include an upper curved portion aR and a lower curved portion bR. In this case, curvatures of the upper curved portion aR and the lower curved portion bR may be different from each other. As another example, curvatures of the upper curved portion aR and the lower curved portion bR may be the same as each other.

Figure 10:
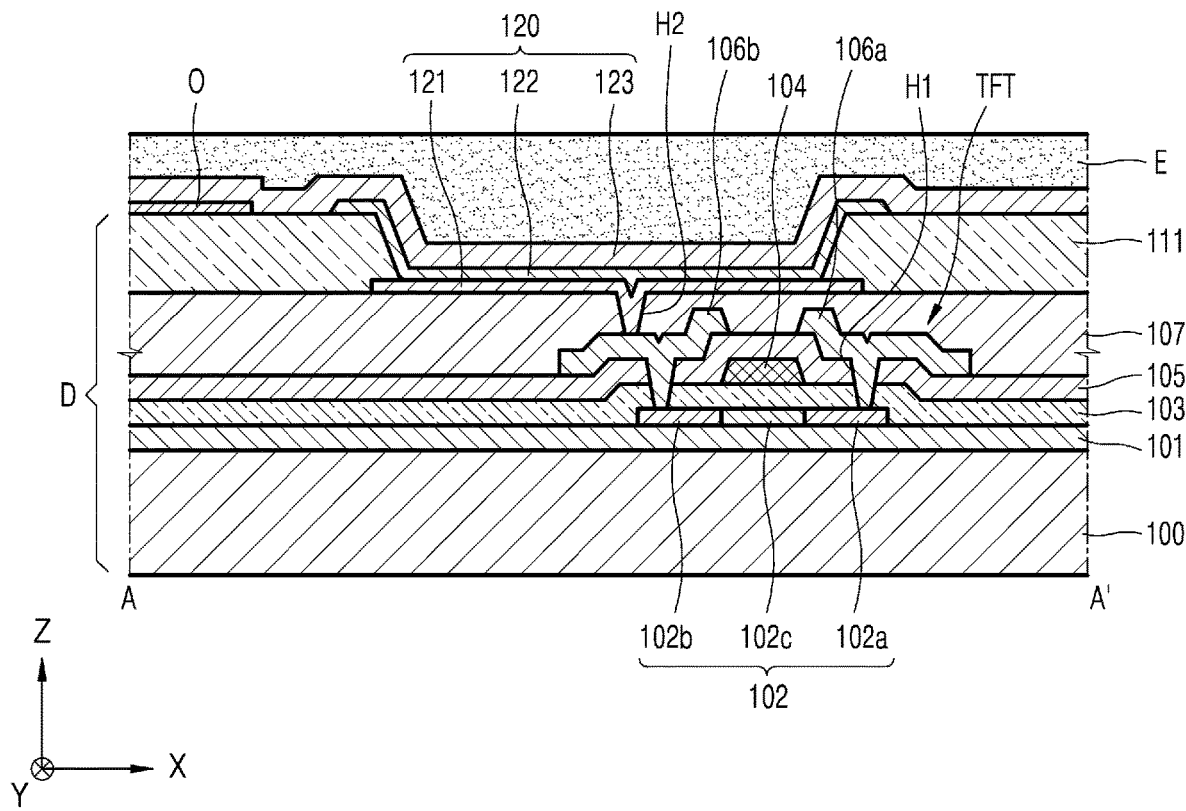
FIG. 10 is a cross-sectional view of the display device, taken along the line A-A' of FIG. 9.
Figure 11:
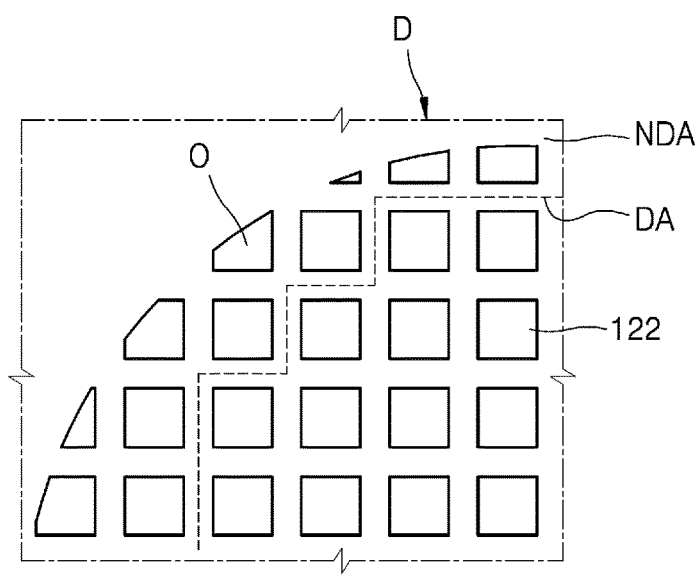
FIG. 11 is a plan view of arrangement of an intermediate layer and a dummy intermediate layer shown in FIG. 10.

FIG. 10 is a cross-sectional view of the display device 1, taken along line A-A' of FIG. 9. FIG. 11 is a plan view of arrangement of an intermediate layer 122 and a dummy intermediate layer O shown in FIG. 10.

Referring to FIGS. 10 and 11, the display device 1 may include the display substrate D, the intermediate layer 122 and the dummy intermediate layer O arranged on the display substrate D, and an opposite electrode 123 arranged on the intermediate layer 122 and the dummy intermediate layer O. Also, the display device 1 may include a thin film encapsulation layer E on the opposite electrode 123.

The display substrate D may include the substrate 100, a thin film transistor TFT, a planarization layer 107, and a pixel electrode 121.

The substrate 100 may include glass or polymer resin such as polyethersulfone, polyarylate, polyetherimide, polyethylene naphthalate, polyethylene terephthalate, polyphenylene sulfide, polyimide, polycarbonate, cellulose acetate propionate, etc.

The thin film transistor TFT may be above the substrate 100, the planarization layer 107 may cover the thin film transistor TFT, and an organic light-emitting diode 120 may be on the planarization layer 107.

A buffer layer 101 may include an inorganic insulating material such as silicon nitride, silicon oxynitride, and silicon oxide, and may have a single-layer or multilayer structure including the inorganic insulating material described above.

After an active layer 102 is formed on the buffer layer 101 in a certain pattern, the active layer 102 is covered by a gate insulating layer 103. The active layer 102 includes a source region 102a and a drain region 102b and further includes a channel region 102c therebetween.

The active layer 102 may include various materials. For example, the active layer 102 may include an inorganic semiconductor material such as amorphous silicon or crystalline silicon. As another example, the active layer 102 may include an oxide semiconductor. As another example, the active layer 102 may include an organic semiconductor material. However, hereinafter, a case in which the active layer 102 includes amorphous silicon will be mainly described in detail for convenience of description.

The active layer 102 may be formed by forming an amorphous silicon film on the buffer layer 101, crystallizing the amorphous silicon film to form a polycrystalline silicon film, and patterning the polycrystalline silicon film. The source region 102a and the drain region 102b of the active layer 102 are doped with impurities depending on a type of the thin film transistor TFT such as a driving thin film transistor or a switching thin film transistor.

A gate electrode 104 corresponding to the active layer 102 and an interlayer insulating layer 105 covering the gate electrode 104 are formed on the gate insulating layer 103.

After a contact hole H1 is formed in the interlayer insulating layer 105 and the gate insulating layer 103, a source electrode 106a and a drain electrode 106b are formed on the interlayer insulating layer 105 to contact the source region 102a and the drain region 102b, respectively.

The planarization layer 107 is formed on the thin film transistor TFT, and the pixel electrode 121 of the organic light-emitting diode 120 is formed on the planarization layer 107. The pixel electrode 121 contacts the drain electrode 106b of the thin film transistor TFT through a via hole H2 formed in the planarization layer 107. The planarization layer 107 may include a single layer or two or more layers including an inorganic material and/or an organic material. The planarization layer 107 may have a flat upper surface regardless of bending of a lower layer or may be bent in accordance with bending of a layer located therebelow. Also, the planarization layer 107 may include a transparent insulator and thus may have a resonance effect.

After the pixel electrode 121 is formed on the planarization layer 107, a pixel-defining layer 111 including an organic material and/or an inorganic material is formed to cover the pixel electrode 121 and the planarization layer 107 and is opened to expose the pixel electrode 121.

Also, the intermediate layer 122 and the opposite electrode 123 are formed on at least the pixel electrode 121. According to some example embodiments, the opposite electrode 123 may be formed over an entire surface of the display substrate D. In this case, the opposite electrode 123 may be formed over the intermediate layer 122, the pixel-defining layer 111, and the dummy intermediate layer O. Hereinafter, for convenience of description, a case in which the opposite electrode 123 is formed over the intermediate layer 122, the pixel-defining layer 111, and the dummy intermediate layer O will be mainly described in detail.

The pixel electrode 121 serves as an anode electrode, and the opposite electrode 123 serves as a cathode electrode. The polarities of the pixel electrode 121 and the opposite electrode 123 may, however, be reversed.

The pixel electrode 121 and the opposite electrode 123 are insulated from each other by the intermediate layer 122, and light is emitted from an organic emission layer by applying voltages of different polarities to the intermediate layer 122.

The intermediate layer 122 may include an organic emission layer. As another alternative example, the intermediate layer 122 may include an organic emission layer and may further include at least one of a hole injection layer, a hole transport layer, an electron transport layer, or an electron injection layer. Embodiments according to the present disclosure are not limited thereto, and the intermediate layer 122 may include an organic emission layer and may further include various functional layers.

In this regard, the intermediate layer 122 may be formed through the above-described apparatus for manufacturing a display device.

Also, the dummy intermediate layer O may be formed on the pixel-defining layer 111 during formation of the intermediate layer 122. Specifically, when the deposition material that has passed through the first pattern hole 1571a (refer to FIG. 3) is deposited on the display substrate D to form the intermediate layer 122, the deposition material that has passed through the second pattern hole 1571b (refer to FIG. 3) may be deposited on the display substrate D to form the dummy intermediate layer O.

In this case, the dummy intermediate layer O and the intermediate layer 122 may include the same material as each other. Particularly, each of the dummy intermediate layer O and the intermediate layer 122 may include at least one of an organic emission layer, a hole injection layer, a hole transport layer, an electron transport layer, an electron injection layer, or a functional layer.

The intermediate layer 122 may include a plurality of intermediate layers 122, and the plurality of intermediate layers 122 may form the display area DA. Particularly, the plurality of intermediate layers 122 may form the display area DA having various shapes. In this regard, the plurality of intermediate layers 122 may be spaced apart from each other inside the display area DA.

The dummy intermediate layer O may include a plurality of dummy intermediate layers O, and the plurality of dummy intermediate layers O may be arranged at the edge (or the boundary) of the display area DA. Particularly, the plurality of dummy intermediate layers O may be arranged outside the plurality of intermediate layers 122. In this regard, the plurality of dummy intermediate layers O may be arranged in the non-display area NDA. Accordingly, the dummy intermediate layer O may not emit light.

An area of at least one of the dummy intermediate layers O may be different from that of one of the intermediate layers 122. Particularly, an area of at least one of the dummy intermediate layers O may be less than that of the intermediate layer 122.

One unit pixel includes a plurality of sub-pixels, and the plurality of sub-pixels may emit light of various colors. For example, the plurality of sub-pixels may include sub-pixels respectively emitting red, green, and blue light, and may include sub-pixels respectively emitting red, green, blue, and white light.

The sub-pixel may include one intermediate layer 122. In this regard, when one sub-pixel is formed, the intermediate layer 122 and the dummy intermediate layer O may be formed through the above-described apparatus 1000 for manufacturing a display device.

The thin film encapsulation layer E may include a plurality of inorganic layers or may include an inorganic layer and an organic layer.

The organic layer of the thin film encapsulation layer E includes a polymer and may include a single layer or stacked layers including one of polyethylene terephthalate, polyimide, polycarbonate, epoxy, polyethylene, and polyacrylate. The organic layer may include polyacrylate, and specifically, may include a polymerized monomer composition including a diacrylate-based monomer and a triacrylate-based monomer. The monomer composition may further include a monoacrylate-based monomer. Also, the monomer composition may further include a well-known photoinitiator such as trimethyl benzoyl diphenyl phosphine oxide (TPO), but embodiments are not limited thereto.

The inorganic layer of the thin film encapsulation layer E may include a single layer or stacked layers including a metallic oxide or a metallic nitride. Specifically, the inorganic layer may include one of $SiN_x$, $Al_2O_3$, $SiO_2$, and $TiO_2$.

An uppermost layer of the thin film encapsulation layer E exposed to the outside may include an inorganic layer to prevent or reduce penetration of moisture into the organic light-emitting diode 120.

The thin film encapsulation layer E may include at least one sandwich structure in which at least one organic layer is between at least two inorganic layers. As another example, the thin film encapsulation layer E may include at least one sandwich structure in which at least one inorganic layer is between at least two organic layers. As another example, the thin film encapsulation layer E may include a sandwich structure in which at least one organic layer is between at least two inorganic layers and a sandwich structure in which at least one inorganic layer is between at least two organic layers.

The thin film encapsulation layer E may include a first inorganic layer, a first organic layer, and a second inorganic layer sequentially arranged over the organic light-emitting diode 120.

As another example, the thin film encapsulation layer E may include a first inorganic layer, a first organic layer, a second inorganic layer, a second organic layer, and a third inorganic layer sequentially arranged over the organic light-emitting diode 120.

As another example, the thin film encapsulation layer E may include a first inorganic layer, a first organic layer, a second inorganic layer, a second organic layer, a third inorganic layer, a third organic layer, and a fourth inorganic layer sequentially arranged over the organic light-emitting diode 120.

In addition, a halogenated metallic layer including lithium fluoride (LiF) may be included between the organic light-emitting diode 120 and the first inorganic layer. The halogenated metallic layer may prevent or reduce damage to the organic light-emitting diode 120 when the first inorganic layer is sputtered thereon.

An area of the first organic layer may be less than that of the second inorganic layer, and an area of the second organic layer may be less than that of the third inorganic layer.

Accordingly, the display device 1 may implement a display area having various shapes.

As described above, according to one or more embodiments, a display device including various types of display areas may be manufactured.

In addition, according to one or more embodiments, a mask assembly may include a first support and a second support each including a protrusion, thereby increasing deposition efficiency and deposition precision.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope as defined by the following claims.

What is claimed is:

1. An apparatus for manufacturing a display device, the apparatus comprising a mask assembly, the mask assembly comprising:
    a mask frame comprising an opening;
    a plurality of first supports spaced apart from each other on the mask frame and each comprising a first center portion crossing the opening in a first direction and a first protrusion protruding from the first center portion in a second direction crossing the first direction;
    a plurality of second supports spaced apart from each other on the mask frame and each comprising a second center portion crossing the opening in a third direction crossing the first direction and a second protrusion protruding from the second center portion in a fourth direction crossing the third direction; and
    a mask sheet comprising a plurality of pattern holes and arranged over the mask frame to be supported by the plurality of first supports and the plurality of second supports,
    wherein the plurality of first supports adjacent to each other and the plurality of second supports adjacent to each other shield a portion of the plurality of pattern holes to define a deposition region.

2. The apparatus of claim 1, wherein the first protrusion comprises
    a first portion protruding from the first center portion in the second direction, and
    a second portion protruding from the first center portion in a fifth direction opposite to the second direction.

3. The apparatus of claim 2, wherein a first distance from the first center portion to an end of the first portion is different from a second distance from the first center portion to an end of the second portion.

4. The apparatus of claim 2, wherein the first portion and the second portion each comprise a curved portion.

5. The apparatus of claim 4, wherein a curvature of the first portion and a curvature of the second portion are different from each other.

6. The apparatus of claim 1, wherein the first center portion further comprises an alignment opening configured to align locations of the first supports and the second supports.

7. The apparatus of claim 1, wherein the second protrusion comprises
    a third portion protruding from the second center portion, and
    a fourth portion protruding from the second center portion and spaced apart from the third portion in the second direction.

8. The apparatus of claim 7, wherein a third distance from the second center portion to an end of the third portion is equal to a fourth distance from the second center portion to an end of the fourth portion.

9. The apparatus of claim 7, wherein the third portion and the fourth portion each comprise a curved portion.

10. The apparatus of claim 7, wherein a first separation distance between the third portion and the fourth portion is equal to a maximum width of a first support from among the first supports in the second direction.

11. The apparatus of claim 7, wherein a first separation distance between the third portion and the fourth portion is less than a maximum width of a first support from among the first supports in the second direction.

12. The apparatus of claim 7, wherein an end of the third portion and an end of the fourth portion are connected to each other through a connection portion.

13. The apparatus of claim 1, wherein the mask sheet comprises a plurality of mask sheets arranged over the mask frame.

14. The apparatus of claim 1, further comprising:
    a source unit facing the mask assembly and configured to supply a deposition material; and
    a magnetic force unit arranged at an opposite side to the source unit with respect to the mask assembly and configured to direct the mask assembly toward a display substrate.

* * * * *